(12) United States Patent
Jeong et al.

(10) Patent No.: US 11,557,653 B2
(45) Date of Patent: Jan. 17, 2023

(54) SEMICONDUCTOR DEVICES

(71) Applicant: SAMSUNG ELECTRONICS CO., LTD., Suwon-si (KR)

(72) Inventors: Soojin Jeong, Suwon-si (KR); Sunwook Kim, Suwon-si (KR); Junbeom Park, Suwon-si (KR); Seungmin Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 35 days.

(21) Appl. No.: 17/345,241

(22) Filed: Jun. 11, 2021

(65) Prior Publication Data

US 2021/0305371 A1    Sep. 30, 2021

Related U.S. Application Data

(63) Continuation of application No. 16/775,513, filed on Jan. 29, 2020, now Pat. No. 11,038,018.

(30) Foreign Application Priority Data

May 14, 2019    (KR) .......................... 10-2019-0056199

(51) Int. Cl.
*H01L 29/08* (2006.01)
*H01L 29/78* (2006.01)
(Continued)

(52) U.S. Cl.
CPC ...... *H01L 29/0847* (2013.01); *H01L 27/0886* (2013.01); *H01L 29/1608* (2013.01); *H01L 29/7854* (2013.01)

(58) Field of Classification Search
CPC ....... H01L 21/02603; H01L 21/823431; H01L 21/823821; H01L 21/845; H01L 27/0886; H01L 27/0924; H01L 27/10879; H01L 27/1211; H01L 29/0665; H01L 29/0669; H01L 29/0673; H01L 29/0847; H01L 29/41791; H01L 29/66439; H01L 29/66636; H01L 29/66795; H01L 29/775; H01L 29/7848; H01L 29/785;
(Continued)

(56) References Cited

U.S. PATENT DOCUMENTS 7,402,483 B2    7/2008 Yun et al.
9,685,554 B1    6/2017 Chang et al.
(Continued)

*Primary Examiner* — David C Spalla
(74) *Attorney, Agent, or Firm* — Lee IP Law, P.C.

(57) ABSTRACT

A semiconductor device includes an active pattern on a substrate, the active pattern extending in a first direction parallel to an upper surface of the substrate, a gate structure on the active pattern, the gate structure extending in a second direction parallel to the upper surface of the substrate and crossing the first direction, channels spaced apart from each other in a third direction perpendicular to the upper surface of the substrate, each of the channels extending through the gate structure, a source/drain layer on a portion of the active pattern adjacent the gate structure, the source/drain layer contacting the channels, and a sacrificial pattern on an upper surface of each of opposite edges of the portion of the active pattern in the second direction, the sacrificial pattern contacting a lower portion of a sidewall of the source/drain layer and including silicon-germanium.

20 Claims, 40 Drawing Sheets

(51) Int. Cl.
*H01L 29/16* (2006.01)
*H01L 27/088* (2006.01)

(58) Field of Classification Search
CPC ............. H01L 29/7851; H01L 29/7853; H01L 29/7855; H01L 2029/7858
See application file for complete search history.

(56) References Cited

U.S. PATENT DOCUMENTS

| | | |
|---|---|---|
| 9,893,182 B2 | 2/2018 | Li |
| 10,032,910 B2 | 7/2018 | Wu et al. |
| 10,084,069 B2 | 9/2018 | Lee et al. |
| 10,163,715 B2 | 12/2018 | Liao et al. |
| 10,748,808 B2 | 8/2020 | Lin et al. |
| 2015/0243733 A1* | 8/2015 | Yang .................... H01L 29/785 257/401 |
| 2015/0303118 A1 | 10/2015 | Wang et al. |
| 2017/0092728 A1 | 3/2017 | Kim et al. |
| 2017/0148914 A1 | 5/2017 | Lee et al. |
| 2017/0256609 A1* | 9/2017 | Bhuwalka ....... H01L 21/823456 |
| 2018/0033626 A1 | 2/2018 | Liao et al. |
| 2018/0151574 A1* | 5/2018 | Li ................... H01L 21/823821 |
| 2018/0337283 A1 | 11/2018 | Li et al. |
| 2019/0035926 A1 | 1/2019 | Mohapatra et al. |
| 2019/0067113 A1* | 2/2019 | Chiang ............... H01L 27/0886 |
| 2019/0067490 A1* | 2/2019 | Yang ................. H01L 29/42392 |
| 2019/0164890 A1* | 5/2019 | Yeoh ............... H01L 21/823807 |
| 2019/0181140 A1* | 6/2019 | Rodder .............. H01L 29/0673 |
| 2019/0245076 A1* | 8/2019 | Seong ................ H01L 29/7854 |
| 2019/0296144 A1* | 9/2019 | Jung .................... H01L 29/785 |
| 2020/0168742 A1 | 5/2020 | Wang et al. |

\* cited by examiner

SEMICONDUCTOR DEVICES

CROSS-REFERENCE TO RELATED APPLICATION

This is a continuation of U.S. patent application Ser. No. 16/775,513 filed Jan. 29, 2020, which is incorporated by reference herein in its entirety.

Korean Patent Application No. 10-2019-0056199, filed on May 14, 2019, in the Korean Intellectual Property Office, and entitled: "Semiconductor Devices," is incorporated by reference herein in its entirety.

BACKGROUND

1. Field

Example embodiments relate to semiconductor devices. More particularly, example embodiments relate to semiconductor devices having vertically stacked channels.

2. Description of the Related Art

When a multi-bridge-channel MOSFET (MBCFET) including a plurality of vertically stacked channels is formed in each of a PMOS region and an NMOS region, processes have to be adjusted in order that the MBCFET may have proper characteristics in each of the PMOS region and the NMOS region. For example, charges moving in a channel in the PMOS region have to have an enhanced mobility, and a channel in the NMOS region have to have a long length. Accordingly, processes for forming the MBCFET having the above characteristics need to be developed.

SUMMARY

According to example embodiments, there is provided a semiconductor device, including an active pattern on a substrate, the active pattern extending in a first direction parallel to an upper surface of the substrate, a gate structure on the active pattern, the gate structure extending in a second direction parallel to the upper surface of the substrate and crossing the first direction, channels spaced apart from each other in a third direction perpendicular to the upper surface of the substrate, each of the channels extending through the gate structure, a source/drain layer on a portion of the active pattern adjacent the gate structure, the source/drain layer contacting the channels, and a sacrificial pattern on an upper surface of each of opposite edges of the portion of the active pattern in the second direction, the sacrificial pattern contacting a lower portion of a sidewall of the source/drain layer and including silicon-germanium.

According to example embodiments, there is provided a semiconductor device, including first channels on a first region of a substrate including the first region and a second region, the first channels being spaced apart from each other in a vertical direction perpendicular to an upper surface of a substrate, second channels on the second region of the substrate, the second channels being spaced apart from each other in the vertical direction, a first gate structure on the first region of the substrate, the first gate structure covering at least a portion of a surface of each of the first channels, a second gate structure on the second region of the substrate, the second gate structure covering at least a portion of a surface of each of the second channels, a first source/drain layer on the first region of the substrate, the first source/drain layer contacting the first channels, and a second source/drain layer on the second region of the substrate, the second source/drain layer contacting the second channels, and a sacrificial pattern contacting a lower portion of a sidewall of the second source/drain layer, the sacrificial pattern including silicon-germanium, wherein a lower surface of the first source/drain layer is a convex curved surface in the vertical direction, and a central portion of a lower surface of the second source/drain layer is flat and edges of the lower surface of the second source/drain layer are rounded.

According to example embodiments, there is provided a semiconductor device, including an active pattern on a substrate, the active pattern extending in a first direction parallel to an upper surface of the substrate, a gate structure on the active pattern, the gate structure extending in a second direction parallel to the upper surface of the substrate and crossing the first direction, channels spaced apart from each other in a third direction perpendicular to the upper surface of the substrate, each of the channels extending through the gate structure in the first direction, a source/drain layer on a portion of the active pattern at each of opposite sides of the gate structure in the first direction, the source/drain layer contacting the channels, and a sacrificial pattern and a fin spacer structure sequentially stacked in the second direction on a lower portion of each of opposite sidewalls of the source/drain layer in the second direction, the sacrificial pattern and the fin spacer structure including different materials from each other.

According to example embodiments, there is provided a semiconductor device. The semiconductor device may include a first transistor and a second transistor. The first transistor may include a first active pattern, a first gate structure, first channels, and a first source/drain layer. The first active pattern may be formed on a first region of a substrate including the first region and a second region, and may extend in a first direction parallel to an upper surface of the substrate. The first gate structure may extend in a second direction parallel to the upper surface of the substrate and crossing the first direction. The first channels may be spaced apart from each other in a third direction perpendicular to the upper surface of the substrate, and each of the first channels may extend partially through the first gate structure. The first source/drain layer may be formed on a portion of the first active pattern at each of opposite sides of the first gate structure in the first direction, and may contact the first channels. The second transistor may include a second active pattern, a second gate structure, second channels, and a second source/drain layer. The second active pattern may be formed on the second region of the substrate, and may extend in the first direction. The second gate structure may be formed on the second active pattern, and may extend in the second direction. The second channels may be spaced apart from each other in the third direction, and each of the second channels may extend partially through the second gate structure. The second source/drain layer may be formed on a portion of the second active pattern at each of opposite sides of the second gate structure in the first direction, and may contact the second channels. The portion of the first active pattern may have an upper surface having a concave curved shape. The portion of the second active pattern may include protrusions protruding upwardly in the third direction at respective opposite edges thereof in the second direction. A sacrificial pattern may be formed on each of the protrusions to contact a sidewall of the second source/drain layer.

According to example embodiments, there is provided a semiconductor device. The semiconductor device may include a first gate structure, first channels, a first source/ drain layer, a first fin spacer, a second fin spacer, a second gate structure, second channels, a second source/drain layer, and a fin spacer structure. The first gate structure may be formed on a first region of a substrate including the first region and a second region. The first channels may be spaced apart from each other in a vertical direction perpendicular to an upper surface of the substrate, and each of the first channels may extend through the first gate structure. The first source/drain layer may be formed at each of opposite sides of the first gate structure, and contact the first channels. The first fin spacer may contact a portion of a sidewall of the first source/drain layer. The second fin spacer may contact the first fin spacer and a portion of the sidewall and an upper surface of the first source/drain layer. The second gate structure may be formed on the second region of the substrate. The second channels may be spaced apart from each other in the vertical direction, and each of the second channels may extend through the second gate structure. The second source/drain layer may be formed at each of opposite sides of the second gate structure, and may contact the second channels. The n spacer structure may contact a portion of a sidewall of the second source/drain layer. A bottom surface of the first fin spacer may be substantially coplanar with a bottom surface of the fin spacer structure, and an uppermost surface of the first fin may be lower than an uppermost surface of the fin spacer structure.

According to example embodiments, there is provided a semiconductor device. The semiconductor device may include first channels, second channels, a first gate structure, a second gate structure, a first source/drain layer and a second source/drain layer. The first channels may be formed on a first region of a substrate including the first region and a second region. The first channels may be spaced apart from each other in a vertical direction perpendicular to an upper surface of the substrate, and each of the first channels may extend in a first direction parallel to the upper surface of the substrate. The second channels may be spaced apart from each other on the second region of the substrate in the vertical direction, and each of the second channels may extend in the first direction. The first gate structure may extend in a second direction on the first region of the substrate to cover at least a portion of a surface of each of the first channels. The second direction may be parallel to the upper surface of the substrate and crossing the first direction. The second gate structure may extend in the second direction on the second region of the substrate to cover at least a portion of a surface of each of the second channels. The first source/drain layer may be formed at each of opposite sides of the first gate structure in the first direction, and may contact the first channels. The second source/drain layer may be formed at each of opposite sides of the second gate structure in the first direction, and may contact the second channels. A third channel among the first channels, which is an uppermost one of the first channels, may have a length in the first direction gradually decreasing from a top toward a bottom thereof. Each of fourth channels among the first channels, which are under the third channel in the first channels, and the second channels may have a length in the first direction substantially constant from a top toward a bottom thereof.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
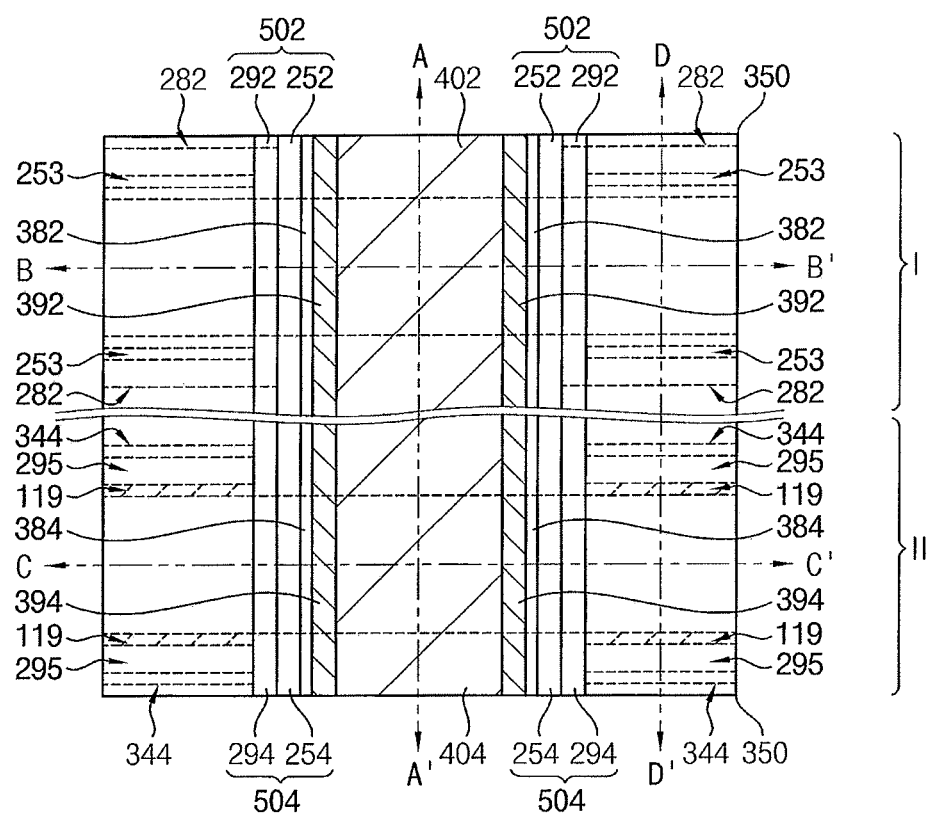
FIG. 1 illustrates a plan view of a semiconductor device in accordance with example embodiments.
Figure 2:
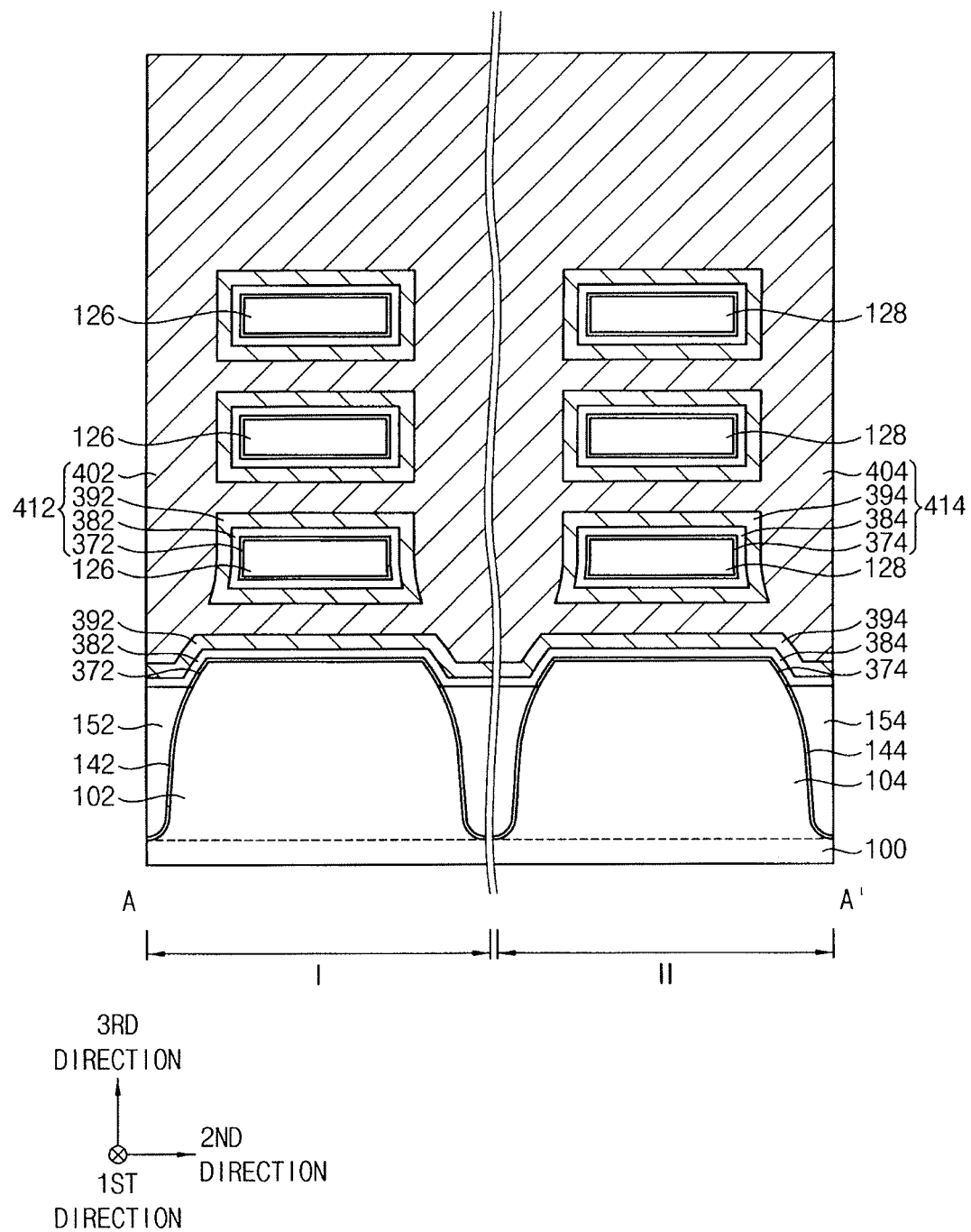
FIG. 2 illustrates a cross-sectional view along line A-A' of FIG. 1.
Figure 3A:
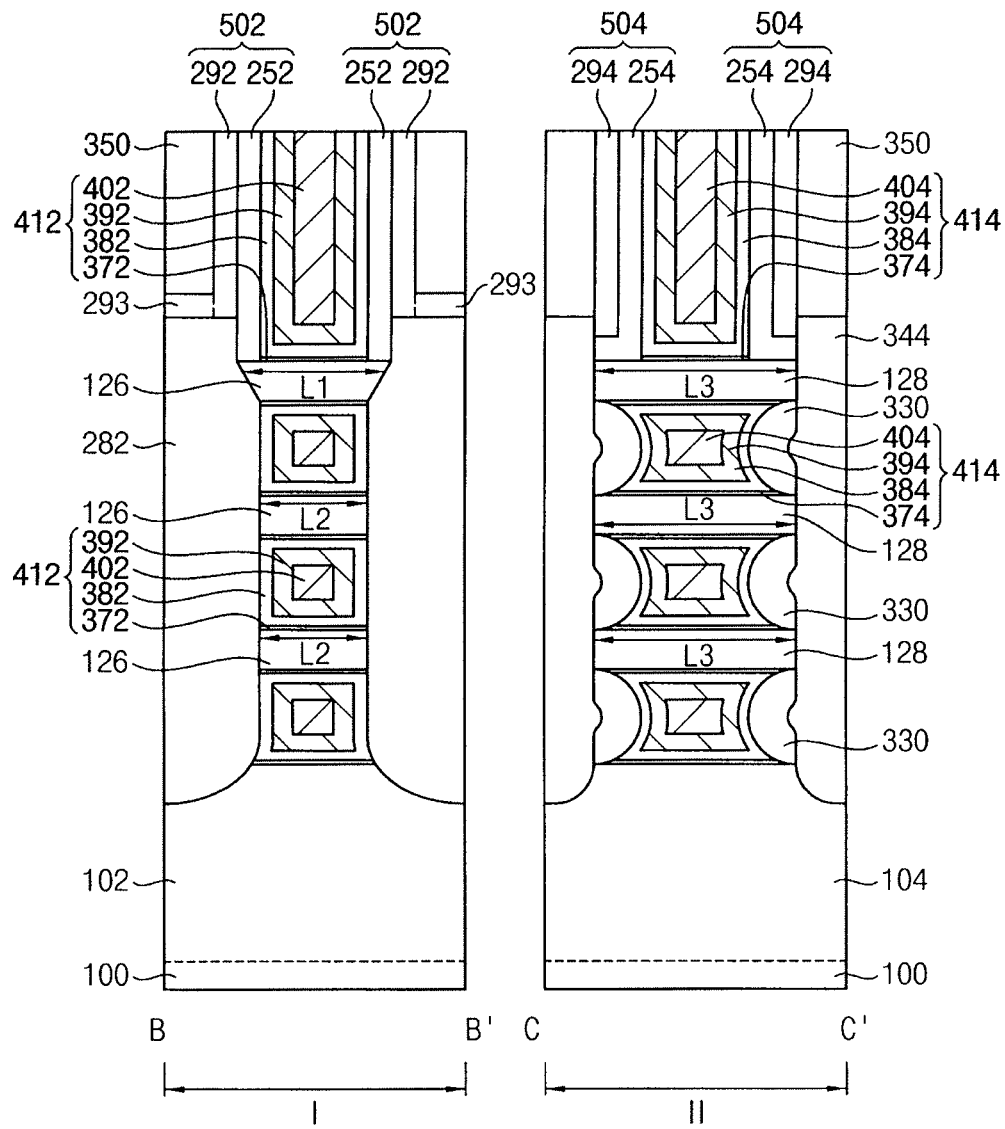
FIGS. 3A-3C illustrate cross-sectional views along lines B-B' and C-C' of FIG. 1 in accordance with example embodiments.
Figure 3A:
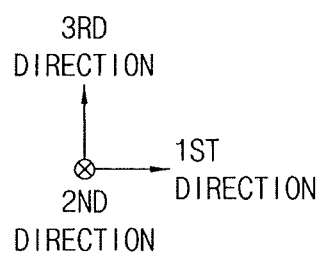
Figure 3B:
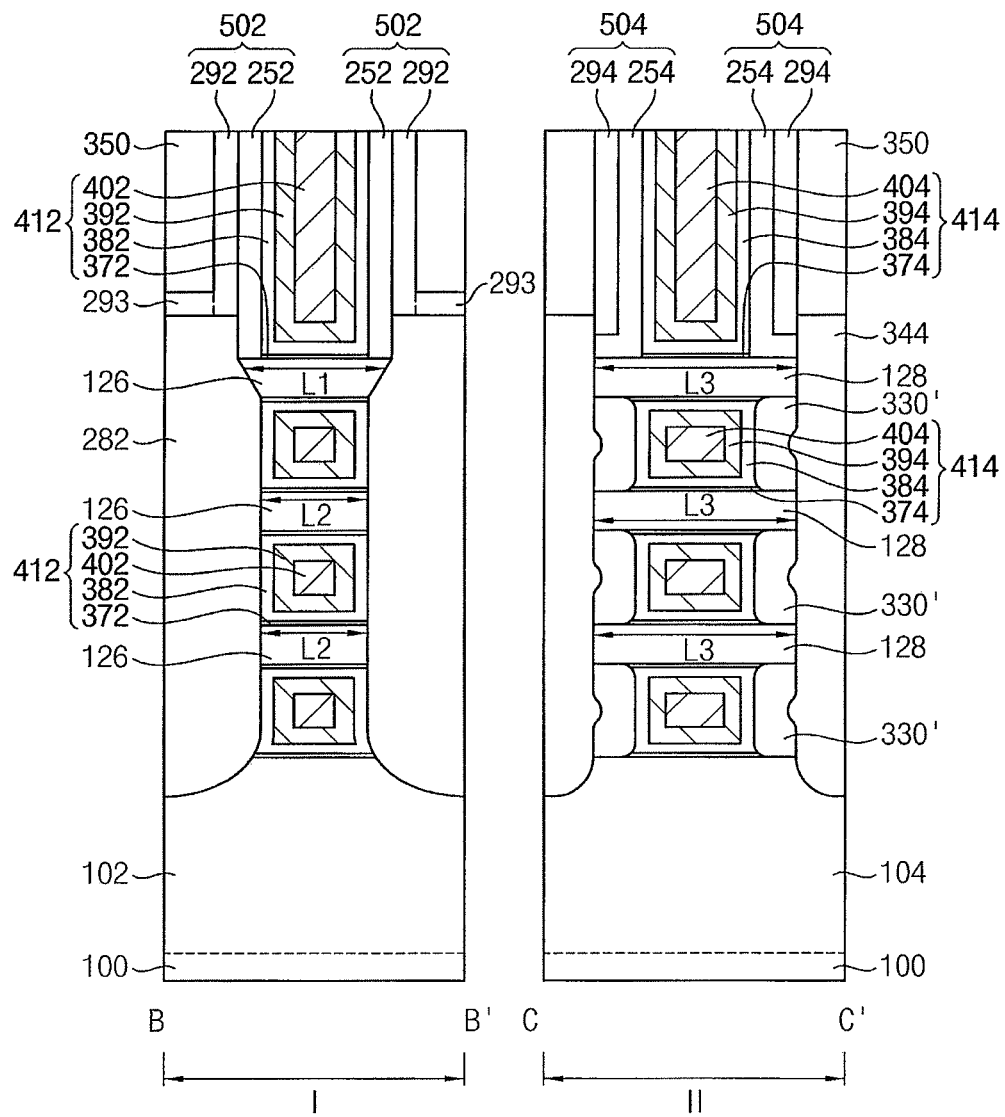
Figure 3C:
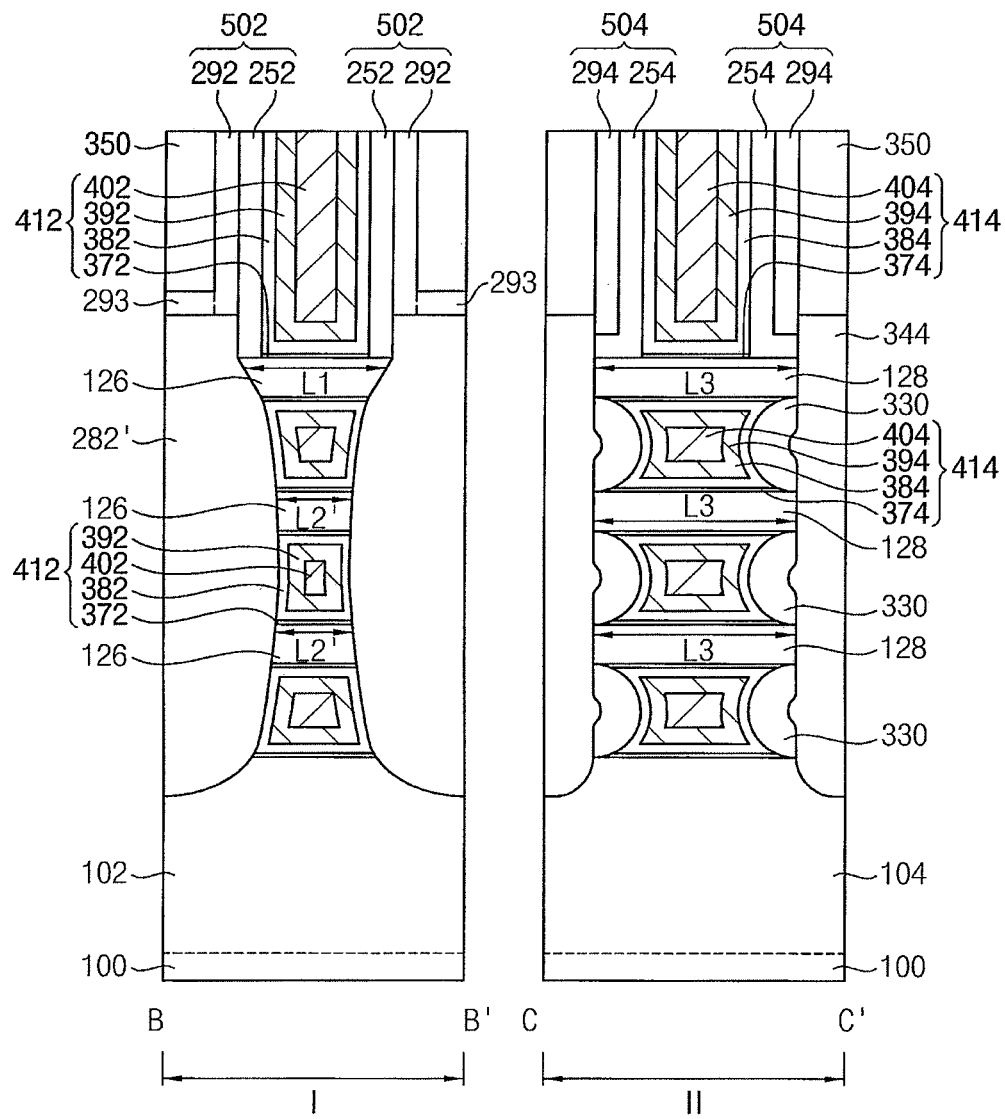
Figure 4:
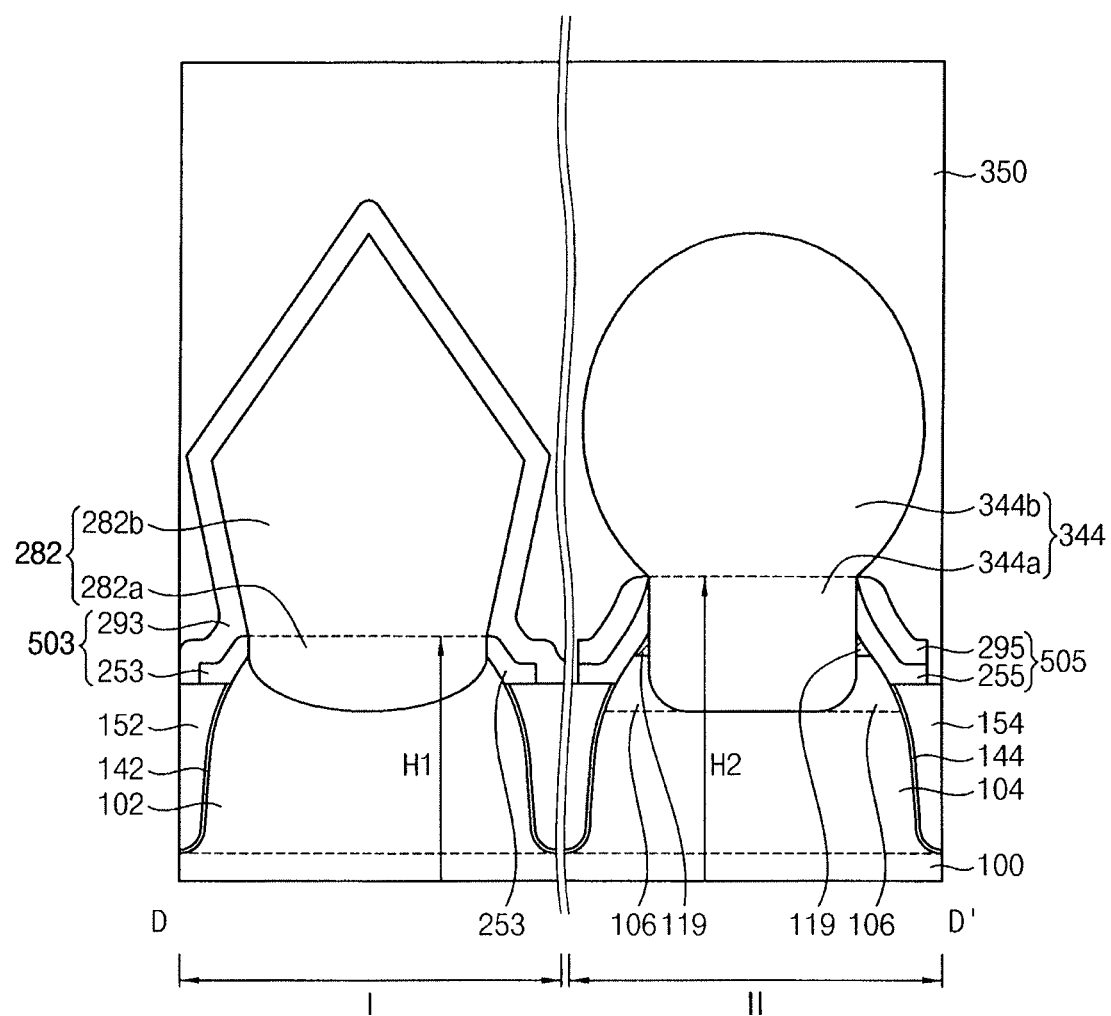
FIG. 4 illustrates a cross-sectional view along line D-D' of FIG. 1.

FIGS. 1, 2, 3A-3C, and 4 are a plan view and cross-sectional views illustrating a semiconductor device in accordance with example embodiments. FIG. 1 is the plan view, FIG. 2 is a cross-sectional view taken along line A-A' of FIG. 1, FIG. 3A includes cross-sections taken along lines B-B' and C-C' of FIG. 1, and FIG. 4 is a cross-sectional view taken along line D-D' of FIG. 1. FIGS. 3B and 3C are modified embodiments corresponding to the view of FIG. 3A.

Hereinafter, two directions substantially parallel to an upper surface of a substrate 100 and crossing each other may be referred to as first and second directions, respectively, and a direction substantially perpendicular to the upper surface of the substrate 100 may be referred to as a third direction. In example embodiments, the first and second directions may be substantially perpendicular to each other.

Referring to FIGS. 1, 2, 3A, and 4, a semiconductor device according to embodiments may include first and second transistors on the first and second regions I and II, respectively, of a substrate 100.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate or a germanium-on-insulator (GOI) substrate.

The first and second regions I and II of the substrate 100 may be close to each other or spaced apart from each other. For example, as illustrated in FIG. 1, the first and second regions I and II of the substrate 100 may be adjacent to each other along the second direction. In an example embodiment, the first region I of the substrate 100 may be a positive-channel metal oxide semiconductor (PMOS) region in which PMOS transistors may be formed, and the second region II of the substrate 100 may be a negative-channel metal oxide semiconductor (NMOS) region in which NMOS transistors may be formed.

The first transistor may be formed on a first active pattern 102 on the first region I of the substrate 100, and may include a first gate structure 412, first semiconductor patterns 126, a first source/drain layer 282, a first gate spacer structure 502, and a first fin spacer structure 503.

The first active pattern 102 may protrude upwardly from the first region I of the substrate 100 in the third direction, and may be also referred to as a first active fin. In example embodiments, the first active pattern 102 may extend in the first direction. In the figures, only one first active pattern 102 is shown, however, embodiments are not limited thereto. Thus, a plurality of first active patterns 102 may be spaced apart from each other in the second direction on the first region I of the substrate 100. The first active pattern 102 may be formed by partially removing an upper portion of the substrate 100, and thus may include a material substantially the same as that of the substrate 100, e.g., a semiconductor material such as silicon.

A sidewall of the first active pattern 102 and an upper surface of the first region I of the substrate 100 may be covered by a first liner 142, and a first isolation pattern 152 may be formed on the first liner 142 to surround a sidewall of the first active pattern 102 (FIG. 2). However, an upper portion of each of opposite sidewalls of the first active pattern 102 in the second direction may not be covered by the first liner 142 and the first isolation pattern 152. The first liner 142 may include a nitride, e.g., silicon nitride, and the first isolation pattern 152 may include an oxide, e.g., tonen silazene (TOSZ).

In example embodiments, the first active pattern 102 may have a concave curved upper surface.

Each of the first semiconductor patterns 126 may extend in the first direction through the first gate structure 412, and a plurality of first semiconductor patterns 126 may be formed at a plurality of levels, respectively, to be spaced apart from each other in the third direction from the upper surface of the first active pattern 102. In the figures, the first semiconductor patterns 126 are shown at three levels, respectively. However, embodiments are not limited thereto.

The first semiconductor patterns 126 may include a material substantially the same as that of the substrate 100 or the first active pattern 102, e.g., silicon. In example embodiments, each of the first semiconductor patterns 126 may serve as a channel of the first transistor, and thus may be referred to as a first channel.

In example embodiments, each of opposite sidewalls of an uppermost one of the first semiconductor patterns 126 in the first direction may not be substantially perpendicular but slanted with respect to an upper surface of the substrate 100. For example, as illustrated in FIG. 3A, an uppermost first semiconductor pattern 126 in a stack of first semiconductor patterns 126 may have slanted opposite lateral sidewalls to have an inverted trapezoidal cross-section. Thus, a first length L1 in the first direction of the uppermost one of the first semiconductor patterns 126 may gradually decrease from a top toward a bottom thereof. Each of opposite lateral sidewalls of other ones of the first semiconductor patterns 126 in the first direction may be substantially perpendicular to the upper surface of the substrate 100, and thus a second length L2 in the first direction thereof may be substantially constant along the third direction. In example embodiments, a minimum value of the first length L1 may be substantially equal to the second length L2, and a maximum value of the first length L1 may be greater than the second length L2.

The first gate structure 412 may be formed on the first active pattern 102 and a portion of the first isolation pattern 152 adjacent the first active pattern 102 in the second direction, and may surround each of the first semiconductor patterns 126.

In the figures, the first gate structure 412 is shown to cover the first semiconductor patterns 126 on one first active pattern 102, however, embodiments are not limited thereto. That is, the first gate structure 412 may extend in the second direction on the first region I of the substrate 100, on which the first isolation pattern 152 is formed, and may commonly cover the first semiconductor patterns 126 on a plurality of first active patterns 102 spaced apart from each other in the second direction.

In the figures, one first gate structure 412 is shown on the first region I of the substrate 100, however, embodiments are not limited thereto. Thus, a plurality of first gate structures 412 spaced apart from each other in the first direction may be formed on the first region I of the substrate 100.

The first gate structure 412 may include a first interface pattern 372, a first gate insulation pattern 382, a first workfunction control pattern 392, and a first gate electrode 402 sequentially stacked from a surface of each of the first semiconductor patterns 126 or the upper surface of the first active pattern 102.

The first interface pattern 372 may be formed on the upper surface of the first active pattern 102 and the surfaces of the first semiconductor patterns 126, and the first gate insulation pattern 382 may be formed on a surface of the first interface pattern 372 and an inner sidewall of the first gate spacer structure 502. The first workfunction control pattern 392 may be formed on the first gate insulation pattern 382, and the first gate electrode 402 may fill a space between the first semiconductor patterns 126 spaced apart from each other in the third direction and a space defined by an inside of the first gate spacer structure 502 on the uppermost one of the first semiconductor patterns 126.

The first interface pattern 372 may include an oxide, e.g., silicon oxide, and the first gate insulation pattern 382 may include a metal oxide having a high-k dielectric constant, e.g., hafnium oxide, tantalum oxide, zirconium oxide, etc.

The first workfunction control pattern 392 may include, e.g., titanium nitride, titanium oxynitride, tantalum nitride, tantalum oxynitride, tungsten nitride, tungsten carbonitride, aluminum oxide, etc. The first gate electrode 402 may include a metal, e.g., titanium, aluminum, etc., a metal alloy, or a nitride or carbide of the metal.

The first gate structure 412 may include an upper portion and a lower portion. The upper portion of the first gate structure 412 may be formed on the uppermost one of the first semiconductor patterns 126, and may overlap the first semiconductor patterns 126 in the third direction. The lower portion of the first gate structure 412 may be formed between neighboring ones of the first semiconductor patterns 126 and between the first active pattern 102 and a lowermost one of the first semiconductor patterns 126, and may overlap the first semiconductor patterns 126 in the third direction. Further, the first gate structure 412 may include a portion on the first isolation pattern 152, i.e., the first gate structure 412 may include a lateral portion not overlapping the first semiconductor patterns 126 in the third direction. A sidewall of the upper portion of the first gate structure 412 may be covered by the first gate spacer structure 502.

The first gate spacer structure 502 may include a first gate spacer 252 covering the sidewall of the upper portion of the first gate structure 412 and a second gate spacer 292 on an outer sidewall of the first gate spacer 252. In example embodiments, a bottom surface of the first gate spacer 252 may be lower than a bottom of the second gate spacer 292. Each of the first and second gate spacers 252 and 292 may include a nitride, e.g., silicon oxynitride, silicon oxycarbonitride, etc., and may be merged with each other if they include the same material.

The first fin spacer structure 503 may include a first fin spacer 253 and a second fin spacer 293. The first fin spacer 253 may cover an upper portion of each of opposite sidewalls (in the second direction) of a portion of the first active pattern 102 not overlapping the first gate structure 412 and the first gate spacer structure 502 in the third direction. The second fin spacer 293 may cover an outer sidewall of the first fin spacer 253.

The first fin spacer 253 may cover an upper portion of the sidewall of the first active pattern 102 not covered by the first liner 142 and the first isolation pattern 152, and may contact a lower portion of a sidewall of the first source/drain layer 282.

The second fin spacer 293 may cover not only the outer sidewall of the first fin spacer 253 but also a surface of an upper portion of the first source/drain layer 282, and further, may extend in the second direction to cover portions of the first isolation pattern 152 and the first liner 142 not overlapping the first gate structure 412 and the first gate spacer structure 502 in the third direction. The second fin spacer 293 and the second gate spacer 292 may be integrally formed, and for convenience of explanation, only a portion of the second gate spacer 292 on the outer sidewall of the first gate spacer 252 will be referred to as the second gate spacer 292 differentially from the second fin spacer 293.

Each of the first and second fin spacers 253 and 293 may include a nitride, e.g., silicon oxynitride, silicon oxycarbonitride, etc., and may be merged with each other if they include the same material. In example embodiments, the first fin spacer 253 and the first gate spacer 252 may include substantially the same material, and the second fin spacer 293 and the second gate spacer 292 may include substantially the same material.

The first source/drain layer 282 may extend in the third direction from the upper surface of the first active pattern 102, and may commonly contact each of opposite sides of the first semiconductor patterns 126 to be connected thereto. The first source/drain layer 282 may contact a lower portion of the outer sidewall of the first gate spacer 252.

In example embodiments, the first source/drain layer 282 may include a lower portion 282a and an upper portion 282b below and above, respectively, a height of an uppermost surface of the first fin spacer 253. The lower portion 282a of the first source/drain layer 282 may have a cross-section in the second direction having a convex curved shape downwardly, e.g., a shape of a portion of an ellipse or circle, and the upper portion 282b of the first source/drain layer 282 may have a cross-section in the second direction having a portion of a polygon, e.g., a pentagon or rectangle. Thus, the first source/drain layer 282 may have a lower surface not flat but convex downwardly.

In example embodiments, the first source/drain layer 282 may include silicon-germanium doped with p-type impurities, and thus may serve as a source/drain of the PMOS transistor.

As illustrated above, lower ones of the first semiconductor patterns 126 may have a length in the first direction less than that of the uppermost one of the first semiconductor patterns 126. Thus, a lower portion of the first source/drain layer 282 commonly contacting the first semiconductor patterns 126 may have a width in the first direction greater than that of an upper portion thereof.

The first transistor may include a plurality of first semiconductor patterns 126 stacked in the third direction in the first gate structure 412. Thus, the first transistor may be an MBCFET.

The second transistor may be formed on a second active pattern 104 on the second region II of the substrate 100, and may include a second gate structure 414, second semiconductor patterns 128, a second source/drain layer 344, a second gate spacer structure 504, a second fin spacer structure 505, an inner spacer 330, and a third sacrificial pattern 119.

The second active pattern 104 may protrude upwardly from the second region II of the substrate 100 in the third direction, and may be also referred to as a second active fin. In example embodiments, the second active pattern 104 may extend in the first direction. In the figures, only one second active pattern 104 is shown, however, embodiments are not limited thereto. Thus, a plurality of second active patterns 104 may be spaced apart from each other in the second direction on the second region II of the substrate 100. The second active pattern 104 may be formed by partially removing an upper portion of the substrate 100, and thus may include a material substantially the same as that of the substrate 100, e.g., a semiconductor material such as silicon. Accordingly, the second active pattern 104 may include the same material as the first active pattern 102.

A sidewall of the second active pattern 104 and an upper surface of the second region II of the substrate 100 may be covered by a second liner 144, and a second isolation pattern 154 may be formed on the second liner 144 to surround a sidewall of the second active pattern 104. However, an upper portion of each of opposite sidewalls of the second active pattern 104 in the second direction may not be covered by the second liner 144 and the second isolation pattern 154. The second liner 144 and the second isolation pattern 154 may include materials substantially the same as those of the first liner 142 and the first isolation pattern 152, respectively.

In example embodiments, a portion of the second active pattern 104 not overlapping the second gate structure 414 and the second gate spacer structure 504 in the third direction may include first protrusions 106 protruding upwardly from opposite edges, respectively, in the second direction, and an upper surface of a portion of the second active pattern 104 between the first protrusions 106 may be flat (FIG. 4). For example, as illustrated in FIG. 4, the upper surface of the portion of the second active pattern 104 between the first protrusions 106 may be parallel to a bottom of the substrate 100.

An inner sidewall of the first protrusion 106 of the second active pattern 104 may contact the second source/drain layer 344, and an outer sidewall of the first protrusion 106 of the second active pattern 104 may contact the second fin spacer structure 505. That is, a bottom surface of the first protrusion 106 may be substantially coplanar with a bottom surface of the second source/drain layer 344, and the bottom surface of the second source/drain layer 344 between the first protrusions 106 neighboring in the second direction may be flat. For example, referring to FIG. 4, while the first protrusions 106 may be integral with the second active pattern 104 and extend seamlessly from the second active pattern 104, a bottom of the protrusions 106 may refer to the imaginary dashed line in FIG. 4 for convenience of description.

Each of the second semiconductor patterns 128 may extend in the first direction through the second gate structure 414, and a plurality of second semiconductor patterns 128 may be formed at a plurality of levels, respectively, to be spaced apart from each other in the third direction from the upper surface of the second active pattern 104. In the figures, the second semiconductor patterns 128 are shown at three levels, respectively. However, embodiments are not limited thereto.

The second semiconductor patterns 128 may include a material substantially the same as that of the first semiconductor patterns 126, and may be formed at heights of corresponding ones of the first semiconductor patterns 126.

In example embodiments, each of the second semiconductor patterns 128 may serve as a channel of the second transistor, and thus may be referred to as a second channel.

In example embodiments, each of opposite sidewalls of the second semiconductor patterns 128 may be substantially perpendicular to the upper surface of the substrate 100. Thus, a third length L3 in the first direction of the second semiconductor patterns 128 may be substantially constant along the third direction. In example embodiments, the third length L3 may be greater than the second length L2, and further may be greater than the maximum value of the first length L1.

The second gate structure 414 may be formed on the second active pattern 104 and a portion of the second isolation pattern 154 adjacent the first active pattern 102 in the second direction, and may surround each of the second semiconductor patterns 128.

In the figures, the second gate structure 414 is shown to cover the second semiconductor patterns 128 on one second active pattern 104. However, embodiments are not limited thereto. That is, the second gate structure 414 may extend in the second direction on the second region II of the substrate 100 on which the second isolation pattern 154 is formed, and may commonly cover the second semiconductor patterns 128 on a plurality of second active patterns 104 spaced apart from each other in the second direction.

In the figures, one second gate structure 414 is shown on the second region II of the substrate 100. However, embodiments are not limited thereto. Thus, a plurality of second gate structures 414 spaced apart from each other in the first direction may be formed on the second region II of the substrate 100.

The second gate structure 414 may include a second interface pattern 374, a second gate insulation pattern 384, a second workfunction control pattern 394, and a second gate electrode 404 sequentially stacked from a surface of each of the second semiconductor patterns 128 or the upper surface of the second active pattern 104.

The second interface pattern 374 may be formed on the upper surface of the second active pattern 104 and the surfaces of the second semiconductor patterns 128, and the second gate insulation pattern 384 may be formed on a surface of the second interface pattern 374, an inner sidewall of the second gate spacer structure 504, and an inner sidewall of the inner spacer 330. The second workfunction control pattern 394 may be formed on the second gate insulation pattern 384, and the second gate electrode 404 may fill a space between the second semiconductor patterns 128 spaced apart from each other in the third direction and the inner spacers 330, and a space defined by an inside of the second gate spacer structure 504 on an uppermost one of the second semiconductor patterns 128.

The second interface pattern 374, the second gate insulation pattern 384, the second workfunction control pattern 394, and the second gate electrode 404 may include materials substantially the same as those of the first interface pattern 372, the first gate insulation pattern 382, the first workfunction control pattern 392, and the first gate electrode 402, respectively. Alternatively, the second interface pattern 374, the second gate insulation pattern 384, the second workfunction control pattern 394, and the second gate electrode 404 may include materials different from those of the first interface pattern 372, the first gate insulation pattern 382, the first workfunction control pattern 392, and the first gate electrode 402, respectively.

The second gate structure 414 may have a stacked structure different from that of the first gate structure 412, and each element of the second gate structure 414 may have a different number of layers from that of a corresponding one of the first gate structure 412. For example, the second workfunction control pattern 394 and/or the second gate electrode 404 in the second gate structure 414 may have stacked layers of which the number is different from that of the first control workfunction control pattern 392 and/or the first gate electrode 402, respectively. Alternatively, the second workfunction control pattern 394 and/or the second gate electrode 404 in the second gate structure 414 may include materials different from those of the first control workfunction control pattern 392 and the first gate electrode 402, respectively, in the first gate structure 412.

The second gate structure 414 may include an upper portion and a lower portion. The upper portion of the second gate structure 414 may be formed on the uppermost one of the second semiconductor patterns 128, and may overlap the second semiconductor patterns 128 in the third direction. The lower portion of the second gate structure 414 may be formed between neighboring ones of the second semiconductor patterns 128 and between the second active pattern 104 and a lowermost one of the second semiconductor patterns 128, and may overlap the second semiconductor patterns 128 in the third direction. Further, the second gate structure 414 may include a portion on the second isolation pattern 154, i.e., a lateral portion not overlapping the second semiconductor patterns 128 in the third direction. A sidewall of the upper portion of the second gate structure 414 may be covered by the second gate spacer structure 504, and a sidewall of the lower portion of the second gate structure 414 may be covered by the inner spacer 330.

The second gate spacer structure 504 may include a third gate spacer 254 covering the sidewall of the upper portion of the second gate structure 414 and a fourth gate spacer 294 on an outer sidewall of the third gate spacer 254. In example embodiments, the third gate spacer 254 may have a cross-section in the second direction having an "L" shape. The third and fourth gate spacers 254 and 294 may include materials substantially the same as those of the first and second gate spacers 252 and 292, respectively, and may be merged thereto if they include the same materials.

The second fin spacer structure 505 may include a third fin spacer 255 and a fourth fin spacer 295. The third fin spacer 255 may cover an upper portion of each of opposite sidewalls in the second direction of a portion of the second active pattern 104 not overlapping the second gate structure 414 and the second gate spacer structure 504 in the third direction, and the fourth fin spacer 295 may be formed on an outer sidewall of the third fin spacer 255.

The first fin spacer 255 may cover an upper portion of the sidewall of the second active pattern 104 not covered by the second liner 144 and the second isolation pattern 154, and may contact a lower portion of a sidewall of the second source/drain layer 284.

The third and fourth fin spacers 255 and 295 may include materials substantially the same as those of the first and second fin spacers 253 and 293, respectively, and may be merged thereto if they include the same materials.

In example embodiments, a second height H2 of an uppermost surface of the second fin spacer structure 505 may be greater than a first height H1 of an uppermost surface of the first fin spacer 253. Alternatively, the second height H2 of the uppermost surface of the second fin spacer structure 505 may be substantially equal to the first height H1 of the uppermost surface of the first fin spacer 253.

The inner spacer 330 may be formed between neighboring ones of the second semiconductor patterns 128 in the third direction, and may cover each of opposite sidewalls of the lower portion of the second gate structure 414 in the first direction. For example, as illustrated in FIG. 3A, the inner spacer 330 may have a cross-section of a shape of a horseshoe or a semicircle having a recess on an outer sidewall thereof. In another example, as illustrated in FIG. 3B, an inner spacer 330' may have a cross-section of a rounded rectangle having a recess on an outer sidewall thereof. The inner spacer 330 (or 330') may include a nitride, e.g., silicon nitride.

The second source/drain layer 284 may extend in the third direction from the upper surface of the second active pattern 104, and may commonly contact each of opposite sides of the second semiconductor patterns 128 to be connected thereto. The second source/drain layer 344 may contact a lower portion of the outer sidewall of the second gate spacer structure 504.

In example embodiments, the second source/drain layer 344 may include a lower portion 344a and an upper portion 344b below and above, respectively, a height of an uppermost surface of the second fin spacer structure 505. The lower portion 344a of the second source/drain layer 344 may have a cross-section in the second direction having a "U" shape, and the upper portion 344b of the second source/drain layer 344 may have a cross-section in the second direction having various shapes, e.g., an ellipse. Thus, the second source/drain layer 344 may have a lower surface in which a central portion is flat and each of opposite edges is rounded. In example embodiments, the second source/drain layer 344 may include silicon doped with n-type impurities or silicon carbide doped with n-type impurities, and thus may serve as a source/drain of the NMOS transistor.

In example embodiments, the third sacrificial pattern 119 may be formed on the first protrusion 106 of the second active pattern 104. An inner sidewall of the third sacrificial pattern 119 may be covered by a sidewall of the lower portion 344a of the second source/drain layer 344, and an outer sidewall of the third sacrificial pattern 119 may be covered by the second fin spacer structure 505. In example embodiments, a bottom surface of the third sacrificial pattern 119 may be higher than a bottom surface of the second source/drain layer 344.

As the third sacrificial pattern 119 is formed, the third sacrificial pattern 119 and the second fin spacer structure 505 may be sequentially stacked in the second direction on each of opposite sidewalls of the lower portion 344a of the second source/drain layer 344 in the second direction. The third sacrificial pattern 119 may extend in the first direction in an area not overlapping the second gate structure 414 and the second gate spacer structure 504 in the third direction. In some embodiments, the third sacrificial pattern 119 may partially overlap the second gate spacer structure 504 in the third direction.

The second transistor may include a plurality of second semiconductor patterns 128 stacked in the third direction in the second gate structure 414, and thus may be an MBCFET.

The semiconductor device may further include contact plugs, wirings, etc., that may be electrically connected to the first and second source/drain layers 282 and 344 and/or the first and second gate structures 412 and 414.

In the semiconductor device, the first source/drain layer 282 of the PMOS transistor may include silicon-germanium having a crystal lattice larger than that of the first semiconductor patterns 126 serving as a channel, and may have a relatively great width in the first direction. Thus, the first source/drain layer 282 may apply a strong compressive stress on the first semiconductor patterns 126, so that the mobility of the charges in the first semiconductor patterns 126 may be enhanced.

As the first source/drain layer 282 in the first transistor has a relatively great width in the first direction, a lowermost one of the first sacrificial patterns 116 (refer to FIGS. 14A and 14B) having a width in the first direction greater than those of other ones of the first sacrificial patterns 116 may not remain, while a lowermost one of the second sacrificial patterns 118 in the second transistor may remain as the third sacrificial pattern 119, which will be illustrated later in a method of manufacturing the semiconductor device.

For example, as illustrated in FIG. 3A, the sidewall of the first source/drain layer 282 may have a linear shape. In another example, as illustrated in FIG. 3C, the sidewall of a first source/drain layer 282' may have a curved line, and thus the volume of the first source/drain layer 282' may be enlarged. However, in this case, not only the uppermost one of the first semiconductor patterns 126 but also the other ones thereof may have a sidewall that may not be perpendicular to the upper surface of the substrate 100 but may have a varying slope. Thus, a second length L2' in the first direction of the other ones of the first source/drain layer 282' may not be constant in the third direction, as further illustrated in FIG. 3C.

FIGS. 5 to 29 are plan views and cross-sectional views illustrating stages in a method of manufacturing a semiconductor device in accordance with example embodiments. FIGS. 5, 7, 10, 13, 16, 19, 24 and 27 are the plan views, and FIGS. 6, 8, 9, 11, 12, 14A, 14B, 15, 17, 18, 20, 21, 22A, 22B, 23A, 23B, 25, 26, 28, and 29 are the cross-sectional views. FIGS. 6, 8-9, 11 and 28 are cross-sectional views taken along lines A-A' of corresponding plan views, each of FIGS. 12, 14A, 14B, 17, 20, 22A, 22B, 23A, 23B, 25 and 29 includes cross-sectional views taken along lines B-B' and C-C' of a corresponding plan view, and FIGS. 15, 18, 21 and 26 are cross-sectional views taken along lines D-D' of corresponding plan views.

Figure 5:
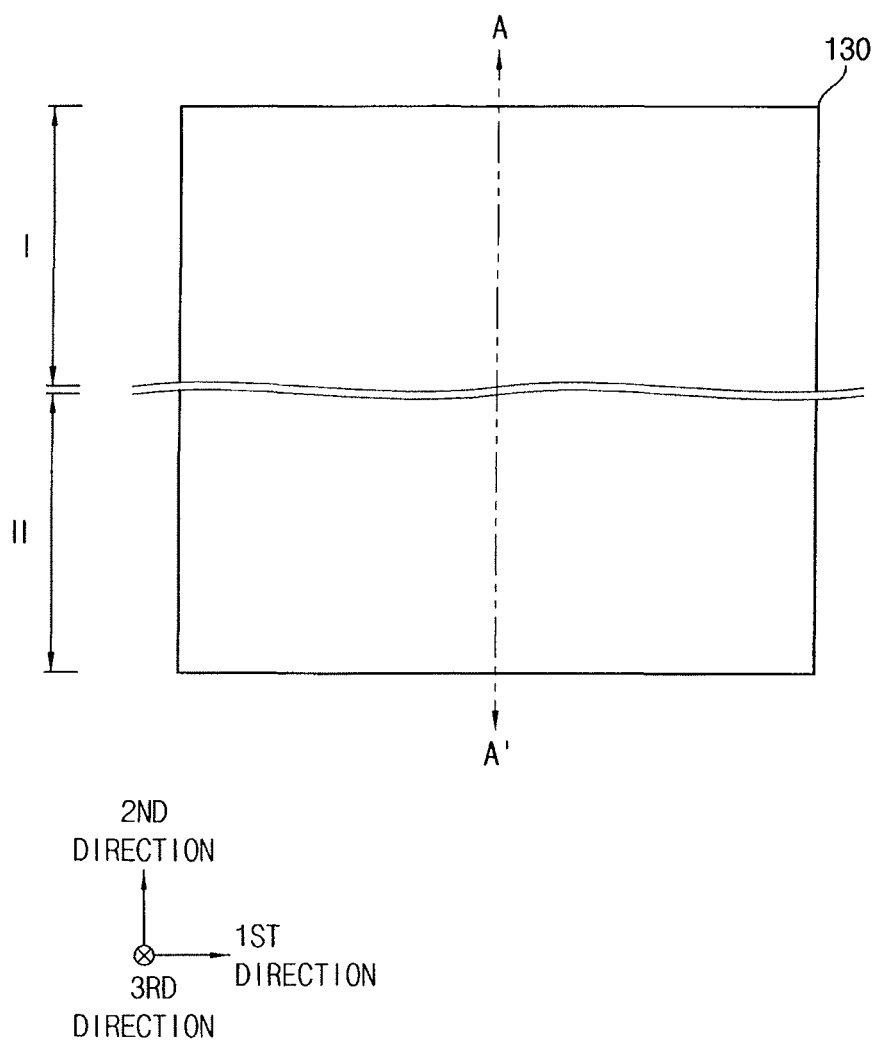
FIGS. 5 to 29 illustrate plan and cross-sectional views of stages in a method of manufacturing a semiconductor device in accordance with example embodiments.
Figure 6:
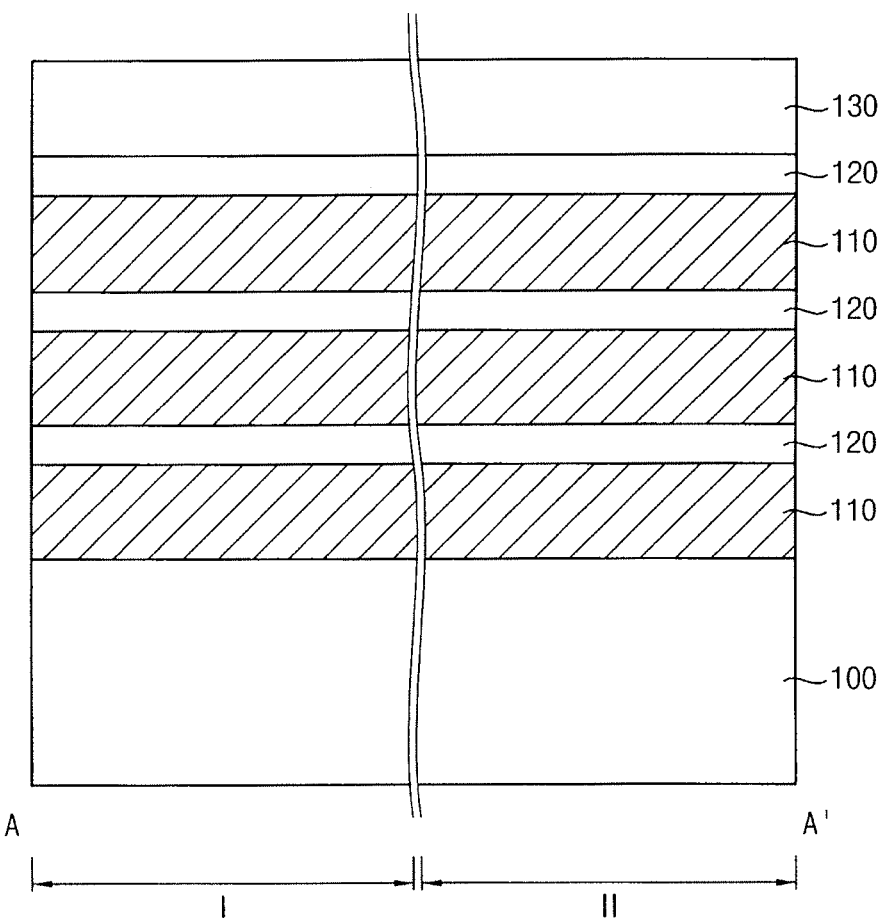
Figure 6:
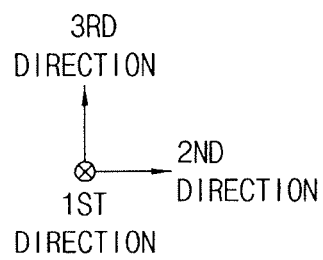

Referring to FIGS. 5 and 6, sacrificial layers 110 and semiconductor layers 120 may be alternately stacked on the substrate 100, which includes first and second regions I and II. A mask layer 130 may be formed on an uppermost one of the semiconductor layers 120.

In example embodiments, the sacrificial layer 110 and the semiconductor layer 120 may be formed by a selective epitaxial growth (SEG) process using an upper portion of the substrate 100 as a seed. In example embodiments, the sacrificial layer 110 may be formed by an SEG process using a silicon source gas, e.g., dichlorosilane ($SiH_2Cl_2$) gas and a germanium source gas, e.g., germane ($GeH_4$) gas. Thus, a single crystalline silicon-germanium layer may be formed. In an example embodiment, the semiconductor layer 120 may be formed by an SEG process using a silicon source gas, e.g., disilane ($Si_2H_6$) gas, and thus a single crystalline silicon layer may be formed.

The mask layer 130 may include a nitride, e.g., silicon nitride. For example, a pad layer may be further formed between the uppermost one of the semiconductor layers 120 and the mask layer 130.

Figure 7:
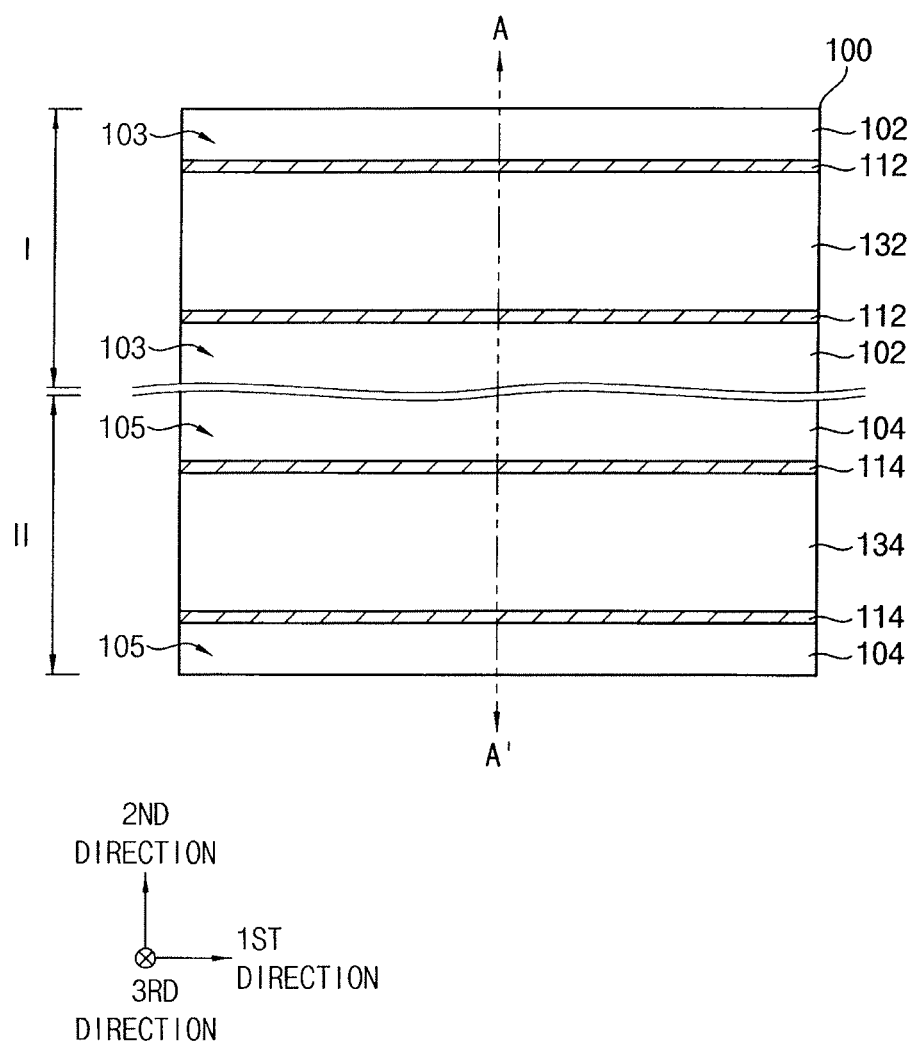
Figure 8:
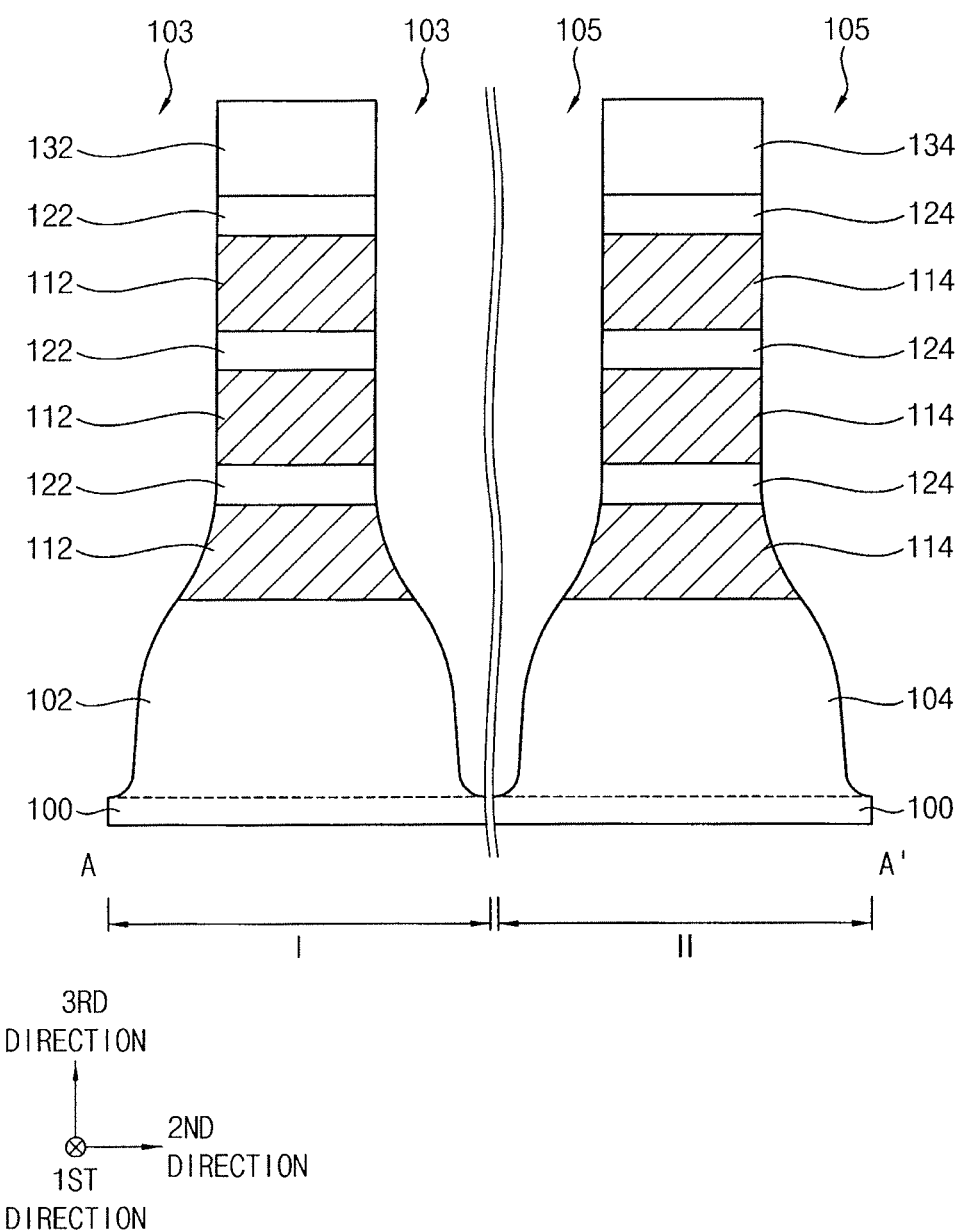

Referring to FIGS. 7 and 8, the mask layer 130 may be patterned to form first and second masks 132 and 134 on the first and second regions I and II, respectively, of the substrate 100. For example, as illustrated in FIG. 7, the first and second masks 132 and 134 may have rectangular shapes extending along the first direction to expose portions of the uppermost one of the semiconductor layers 120.

As illustrated in FIG. 8, the semiconductor layers 120, the sacrificial layers 110, and an upper portion of the substrate 100 may be etched using the first and second masks 132 and 134 as etching masks to form first and second trenches 103 and 105 on the first and second regions I and II, respectively, of the substrate 100. The first and second trenches 103 and 105 may expose portions of the etched substrate 100, which define first and second active patterns 102 and 104, respectively.

In detail, the first active pattern 102 may be formed on the first region I of the substrate 100 to extend in the first direction (e.g., along the first mask 132), and a first fin structure including first sacrificial lines 112 and first semiconductor lines 122 alternately and repeatedly stacked on each other may be formed on the first active pattern 102 (FIG. 8). The first mask 132 may be on the first fin structure. Hereinafter, the first active pattern 102, the first fin structure, and the first mask 132 sequentially stacked may be referred to as a first structure.

Similarly, the second active pattern 104 may be formed on the second region II of the substrate 100 to extend in the first direction (e.g., along the second mask 134), and a second fin structure including second sacrificial lines 114 and second semiconductor lines 124 alternately and repeatedly stacked on each other may be formed on the second active pattern 104. The second mask 134 may be on the second fin structure. Hereinafter, the second active pattern 104, the second fin structure, and the second mask 134 sequentially stacked may be referred to as a second structure.

In example embodiments, due to the characteristics of the etching process, lowermost ones of the respective first and second sacrificial lines 112 and 114 may have sidewalls not perpendicular but slanted with respect to the upper surface of the substrate 100 unlike those of upper ones of the respective first and second sacrificial lines 112 and 114. For example, referring to FIG. 8, each of the lowermost ones of the first and second sacrificial lines 112 and 114 may have a width in the second direction gradually increase from a top toward a bottom thereof, and thus a length in the second direction of a bottom surface of each of the lowermost ones of the first and second sacrificial lines 112 and 114 may be greater than a length in the second direction of each of the upper ones of the first and second sacrificial lines 112 and 114.

Figure 9:
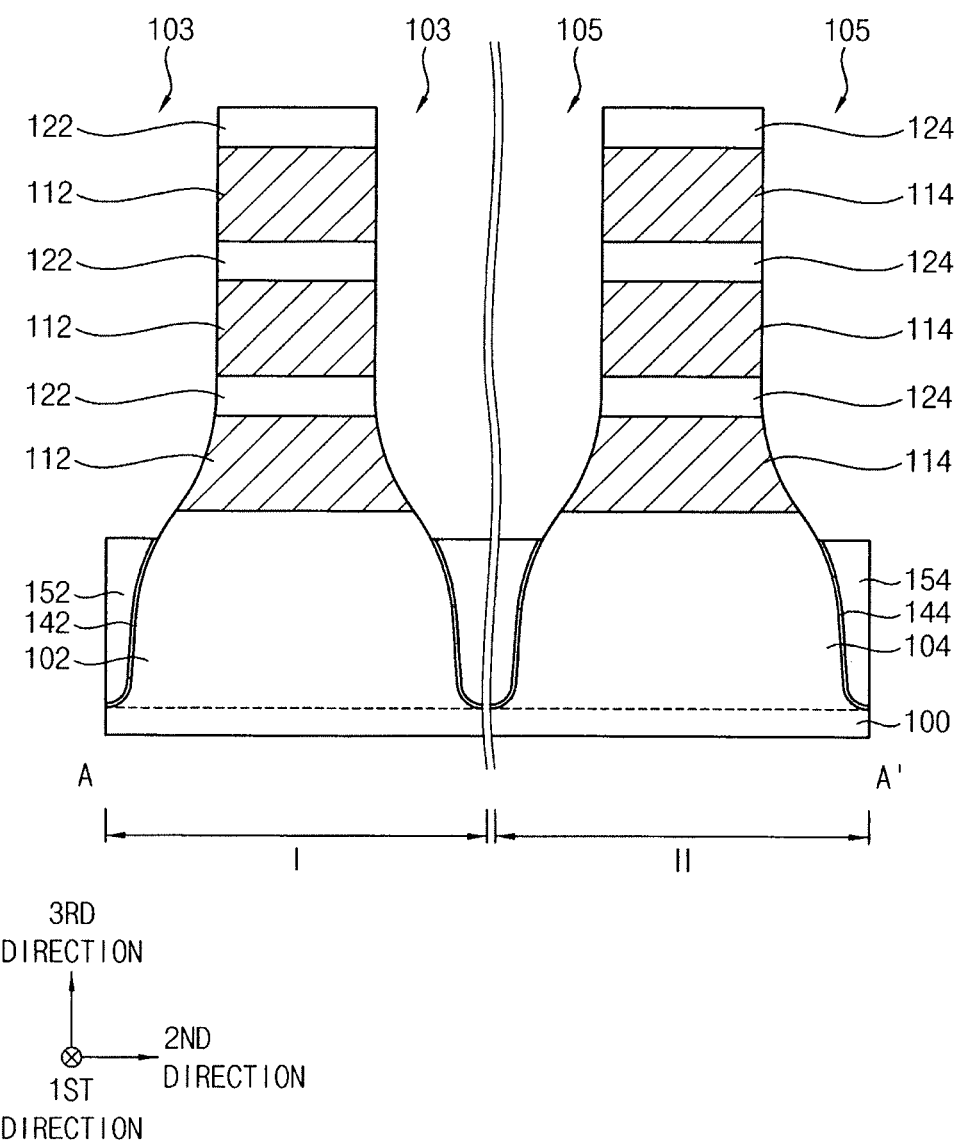

Referring to FIG. 9, a liner layer may be formed on surfaces of the first and second structures and the upper surface of the substrate 100, and an isolation layer may be formed on the liner layer to fill the first and second trenches 103 and 105 to a height sufficiently higher than top surfaces of the first and second structures. The liner layer may cover the first and second sacrificial lines 112 and 114 and/or the first and second semiconductor lines 122 and 124 in the respective first and second structures, so as not to be oxidized. The isolation layer may be planarized until portions of the liner layer on the top surfaces of the first and second structures may be exposed. In example embodiments, the planarization process may include a chemical mechanical polishing (CMP) process.

Upper portions of the liner layer and the isolation layer may be removed, and the first and second masks 132 and 134 may be also removed. Thus, sidewalls of the first and second fin structures may be exposed, and upper sidewalls of the first and second active patterns 102 and 104 may be also exposed.

As a result, the first and second active patterns 102 and 104, the first and second fin structures, first and second liners 142 and 144 covering the sidewalls of the respective first and second active patterns 102 and 104 and the upper surface of the substrate 100, and first and second isolation patterns 152 and 154 filling the respective first and second trenches 103 and 105 on the respective first and second liners 142 and 144 may be formed on the first and second regions I and II, respectively, of the substrate 100.

Figure 10:
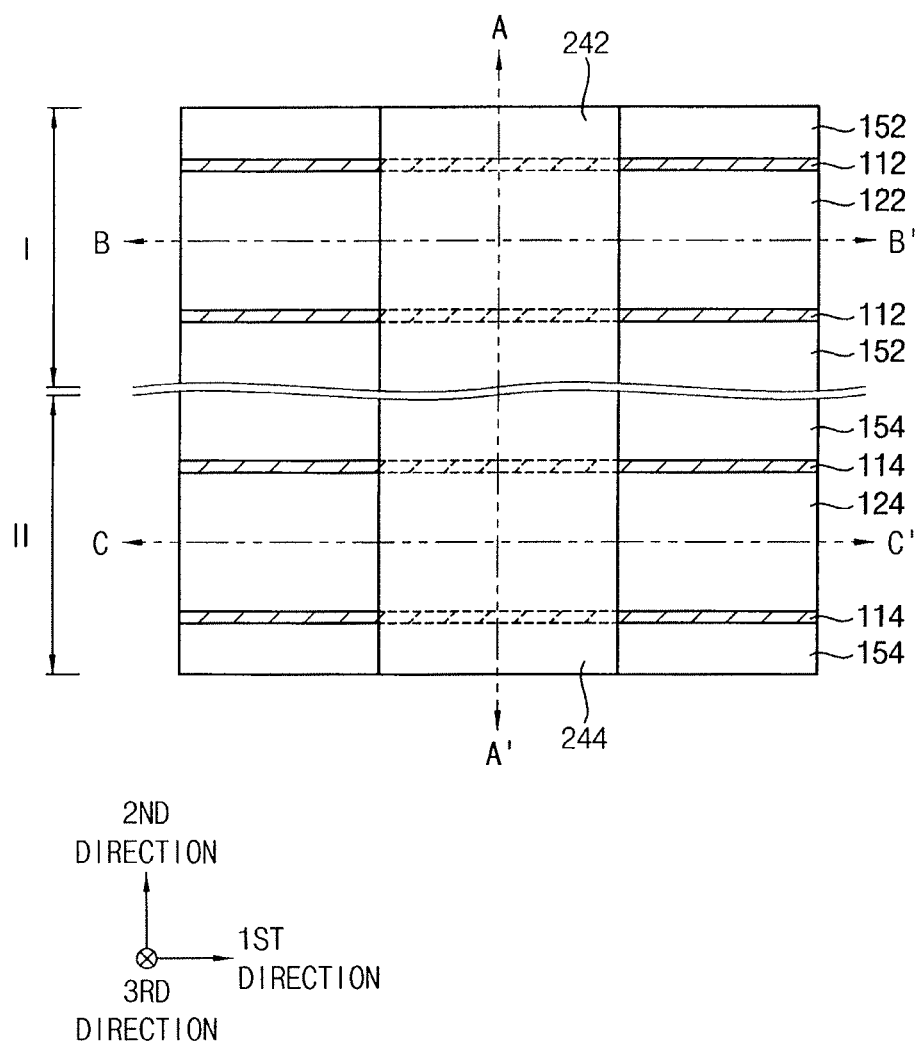
Figure 11:
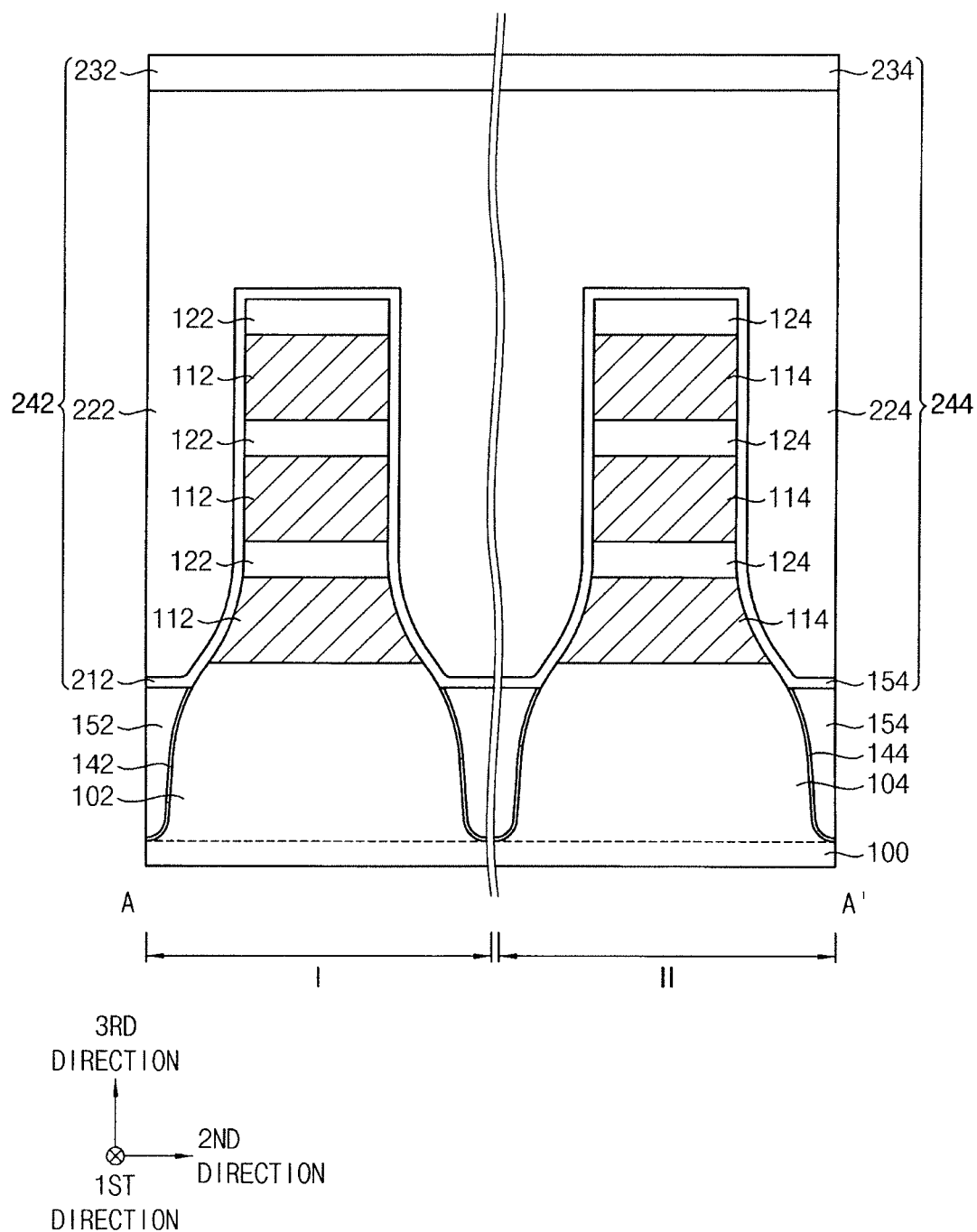
Figure 12:
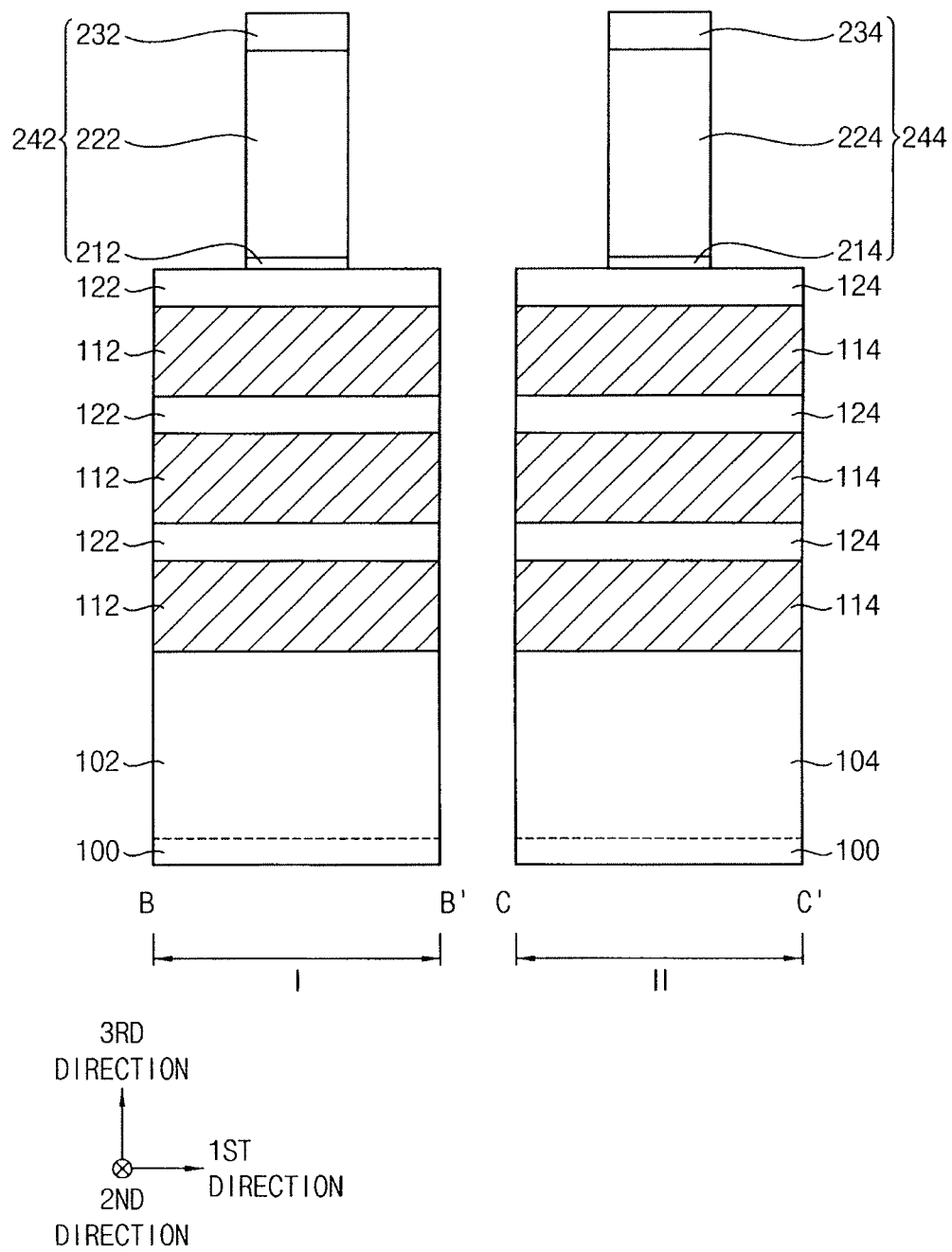

Referring to FIGS. 10 to 12, first and second dummy gate structures 242 and 244 may be formed on the respective first isolation patterns 152 and 154 and the respective first and second liners 142 and 144 to partially cover the first and second fin structures, respectively.

Particularly, a dummy gate insulation layer, a dummy gate electrode layer, and a dummy gate mask layer may be sequentially formed on the substrate 100 having the first and second fin structures, the first and second isolation patterns 152 and 154, and the first and second liners 142 and 144 thereon. First photoresist patterns extending in the second direction may be formed on the dummy gate mask layer to partially cover the first and second regions I and II, respectively, of the substrate 100, and the dummy gate mask layer may be etched using the first photoresist patterns as an etching mask to form first and second dummy gate masks 232 and 234 on the first and second regions I and II, respectively, of the substrate 100. The dummy gate insulation layer may include an oxide, e.g., silicon oxide, the dummy gate electrode layer may include, e.g., polysilicon, and the dummy gate mask layer may include a nitride, e.g., silicon nitride.

The dummy gate electrode layer and the dummy gate insulation layer may be etched using the first and second dummy gate masks 232 and 234 as an etching mask to form a first dummy gate electrode 222 and a first dummy gate insulation pattern 212, respectively, on the first region I of the substrate 100 and to form a second dummy gate electrode 224 and a second dummy gate insulation pattern 214, respectively, on the second region II of the substrate 100. The first dummy gate insulation pattern 212, the first dummy gate electrode 222, and the first dummy gate mask 232 sequentially stacked on the first structure and a portion of the first isolation pattern 152 adjacent thereto may form the first dummy gate structure 242. The second dummy gate insulation pattern 214, the second dummy gate electrode 224, and the second dummy gate mask 234 sequentially stacked on the second structure and a portion of the second isolation pattern 154 adjacent thereto may form the second dummy gate structure 244.

In example embodiments, the first dummy gate structure 242 may extend in the second direction on the first fin structure and the first isolation pattern 152, and may cover an upper surface and opposite sidewalls in the second direction of the first fin structure. The first dummy gate structure 242 may also cover an upper sidewall of the first active pattern 102.

The second dummy gate structure 244 may extend in the second direction on the second fin structure and the second isolation pattern 154, and may cover an upper surface and opposite sidewalls in the second direction of the second fin structure. The second dummy gate structure 244 may also cover an upper sidewall of the second active pattern 104.

Figure 13:
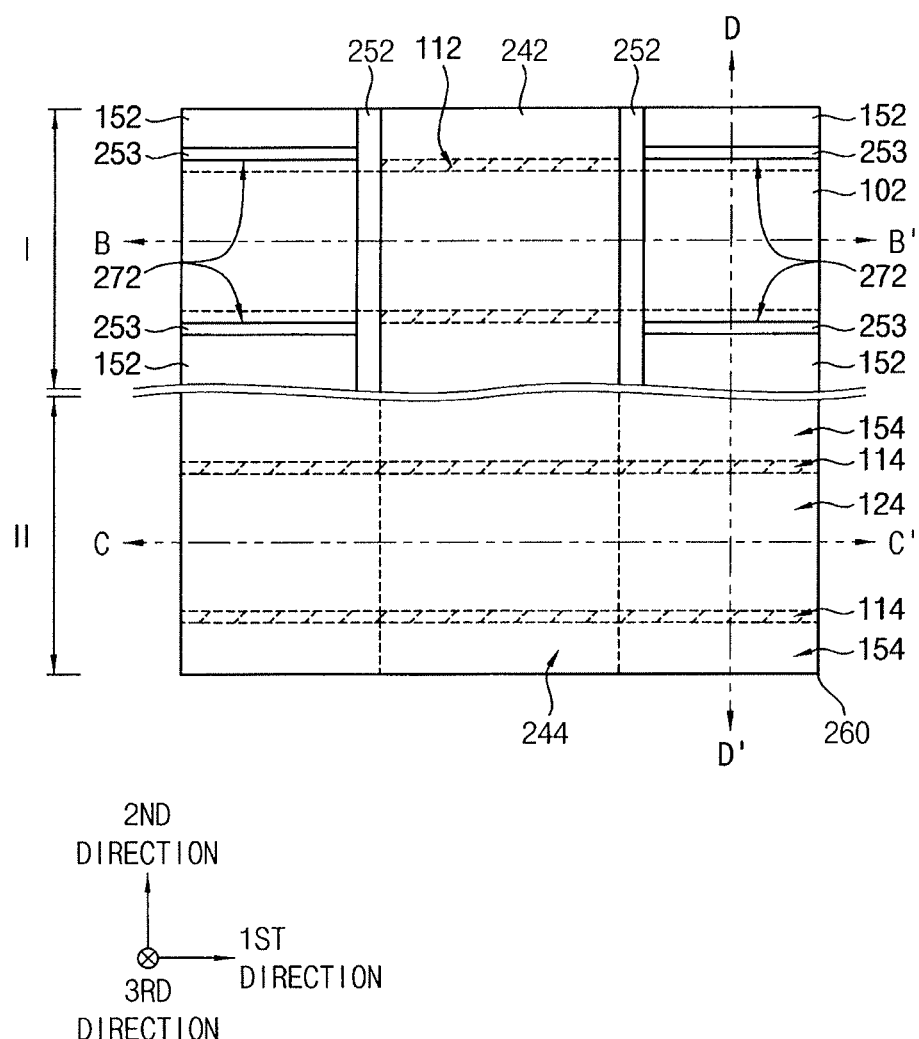
Figure 14A:
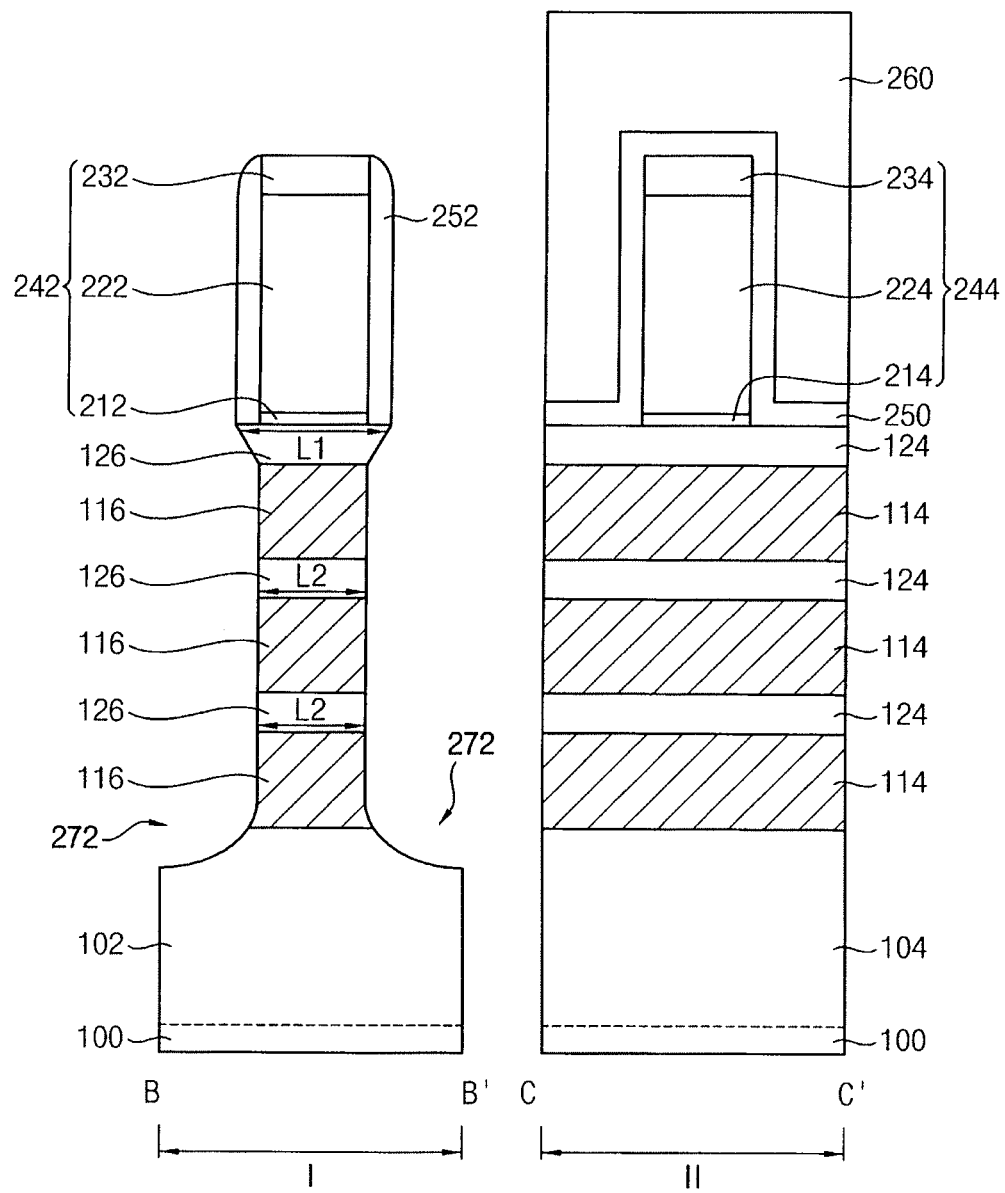
Figure 15:
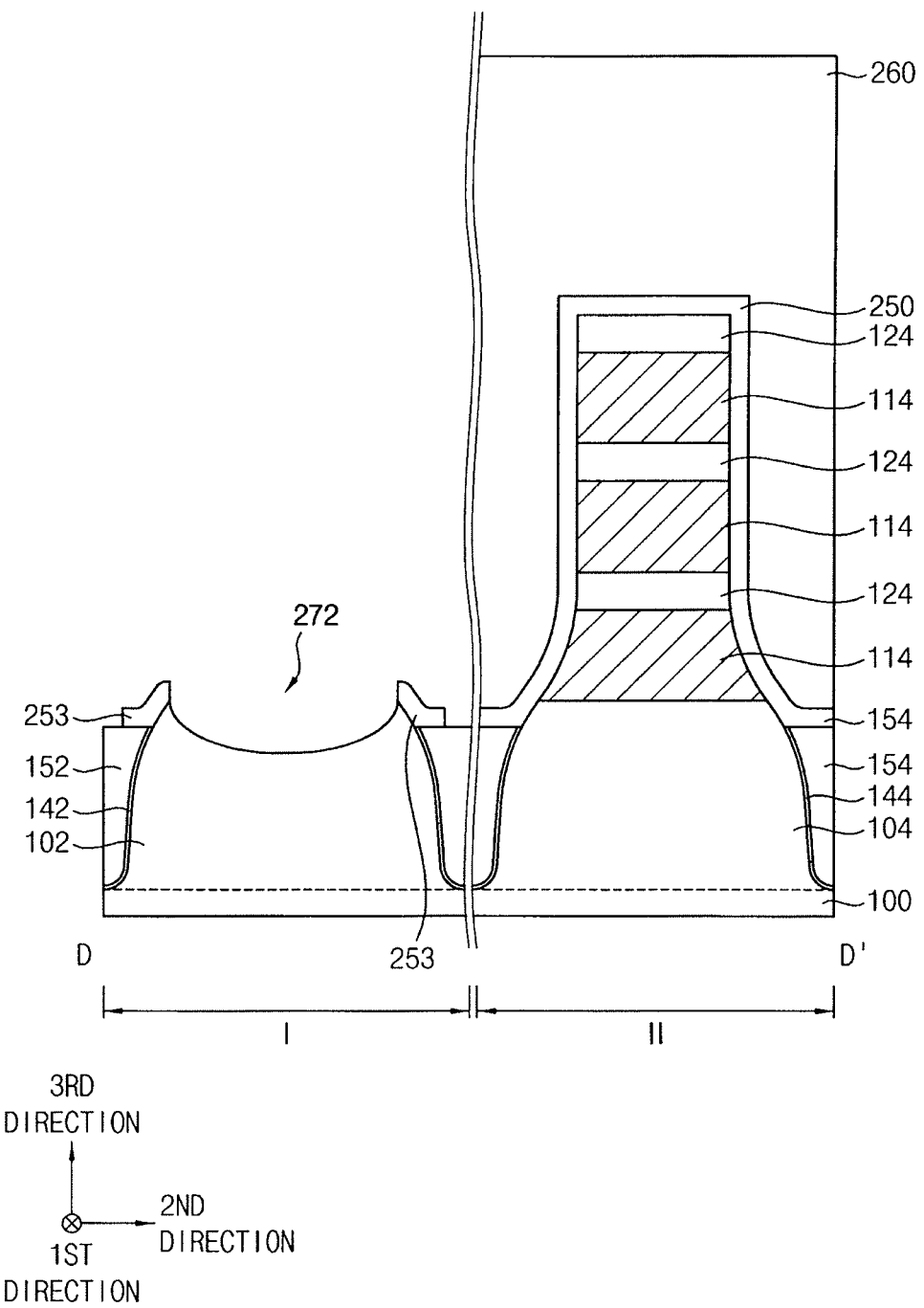

Referring to FIGS. 13, 14A and 15, a first spacer layer 250 may be formed on the substrate 100 having the first and second fin structures, the first and second isolation patterns 152 and 154, the first and second liners 142 and 144, and the first and second dummy gate structures 242 and 244. A second photoresist pattern 260 covering the second region II of the substrate 100 may be formed on the first spacer layer 250, and a portion of the first spacer layer 250 on the first region I of the substrate 100 may be etched using the second photoresist pattern 260 as an etching mask. Thus, the first gate spacer 252 may be formed on each of opposite sidewalls of the first dummy gate structure 242 in the first direction, and a first fin spacer 253 may be formed on each of opposite sidewalls of the first fin structure in the second direction.

The first fin structure may be etched using the first dummy gate structure 242 and the first gate spacer 252 as an etching mask to form a first recess 272 exposing an upper surface of the first active pattern 102 of the substrate 100. Thus, the first sacrificial lines 112 and the first semiconductor lines 122 under the first dummy gate structure 242 and the first gate spacer 252 may be transformed into first sacrificial patterns 116 and first semiconductor patterns 126, respectively, and the first fin structure extending in the first direction may be divided into a plurality of fin structures spaced apart from each other in the first direction.

Hereinafter, for the convenience of explanation, the first dummy gate structure 242, the first gate spacer 252, and the first fin structure altogether may be referred to as a third structure. In example embodiments, the third structure may extend in the second direction, and a plurality of third structures may be spaced apart from each other in the first direction.

The first recess 272 formed by the etching process may have a volume as large as possible. In example embodiments, the first recess 272 may have a volume greater than a comparative recess having a vertical sidewall aligned with an outer sidewall of the first gate spacer 252 in the third direction. Thus, a sidewall of the first recess 272 may be closer to a central portion of the first dummy gate structure 242 in the first direction than the outer sidewall of the first gate spacer 252 is, e.g., a distance along the first direction between the sidewall of the first recess 272 and a central vertical axis of the first dummy gate structure 242 may be smaller than a distance along the first direction between the outer sidewall of the first gate spacer 252 and the central vertical axis of the first dummy gate structure 242 (FIG. 14A).

In example embodiments, an uppermost one of the first semiconductor patterns 126 may have a sidewall that may not be perpendicular to the upper surface of the substrate but slanted thereto. Thus, the first length L1 of the uppermost one of the first semiconductor patterns 126 in the first direction may gradually decrease from a top toward a bottom thereof. Other ones of the first semiconductor patterns 126 may have sidewalls that may be substantially perpendicular to the upper surface of the substrate 100, and thus the second length L2 of the other ones of the first semiconductor patterns 126 in the first direction may be constant along the third direction. In example embodiments, a minimum value of the first length L1 may be substantially equal to the second length L2, and a maximum value of the first length L1 may be greater than the second length L2.

As the first recess 272 may have a relatively large volume, portions of the first sacrificial lines 112 and the first semiconductor lines 122 at opposite sides of the first dummy gate structure 242 in the first direction may be entirely removed during the etching process. For example, the lowermost one of the first sacrificial lines 122 having a relatively large width in the first direction may be entirely removed.

The first fin spacer 253 may be almost removed during the etching process. However, a portion of the first fin spacer 253 covering an upper portion of each of opposite sidewalls of the first active pattern 102 in the second direction may remain. The first fin spacer 253 may be used for controlling a horizontal width of a first source/drain layer 282 (refer to FIGS. 16 to 18), and a height of an uppermost surface of the first fin spacer 253 remaining after the etching process may be adjusted so that the first source/drain layer 282 may have a desired width.

In example embodiments, the first recess 272 may have a lower surface that may not be flat but may have a convex curved shape downwardly. An upper surface of the first active pattern 102 may have a concave curved shape corresponding to the shape of the first recess 272.

Figure 14B:
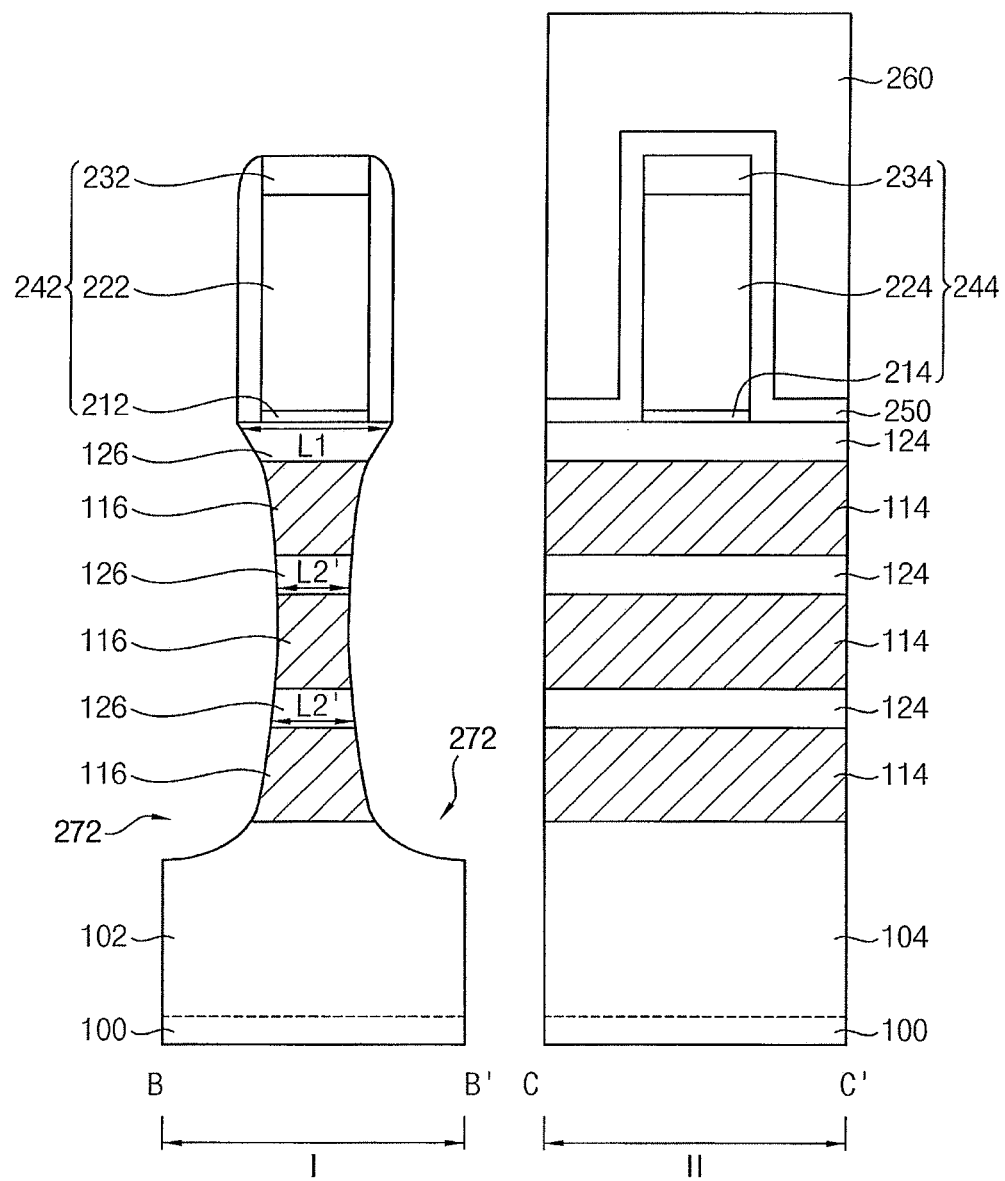

In another example, referring to FIG. 14B, the first recess 272 may have a curved shape, and thus the volume of the first recess 272 may be maximized. In this case, each of the first semiconductor patterns 126 may have a sidewall that may not be vertical but may have a varying slope, and thus the second length L2' of lower ones of the first semiconductor patterns 126 may not be constant along the third direction.

Hereinafter, only the first recess 272 having the sidewall shown in FIG. 14A will be explained.

Figure 16:
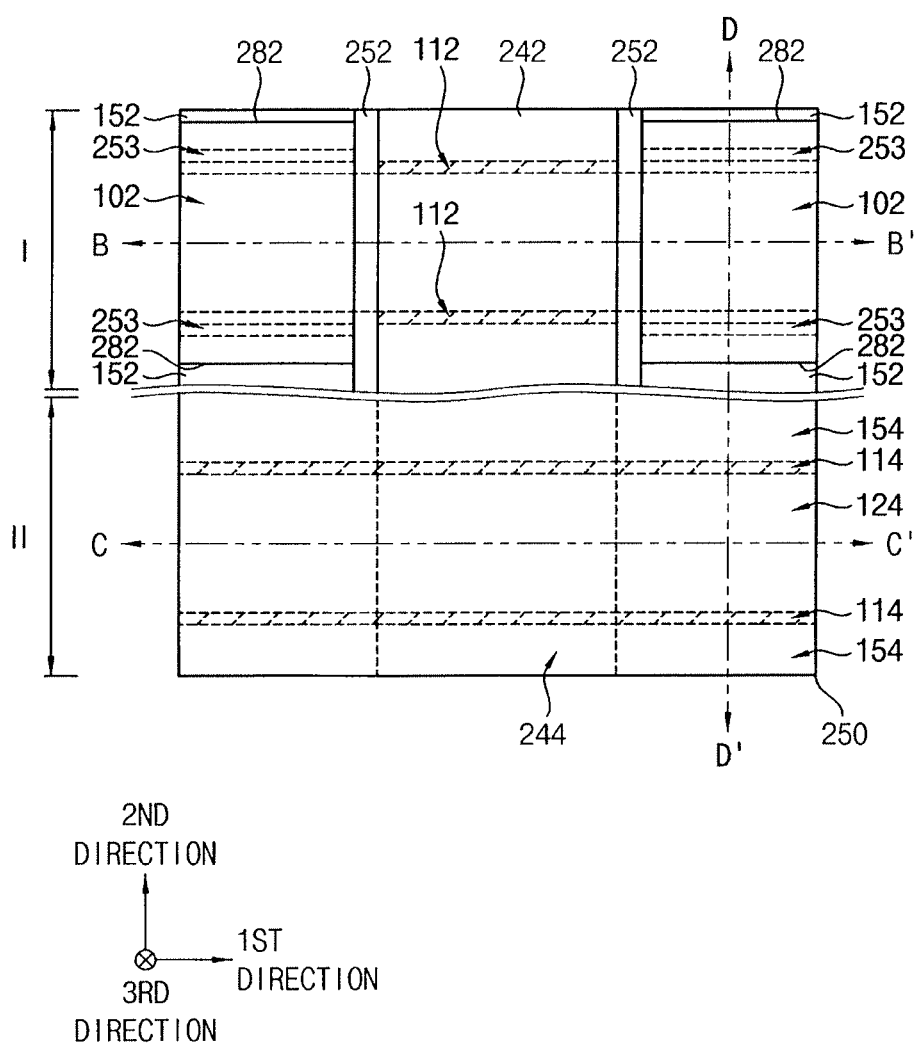
Figure 17:
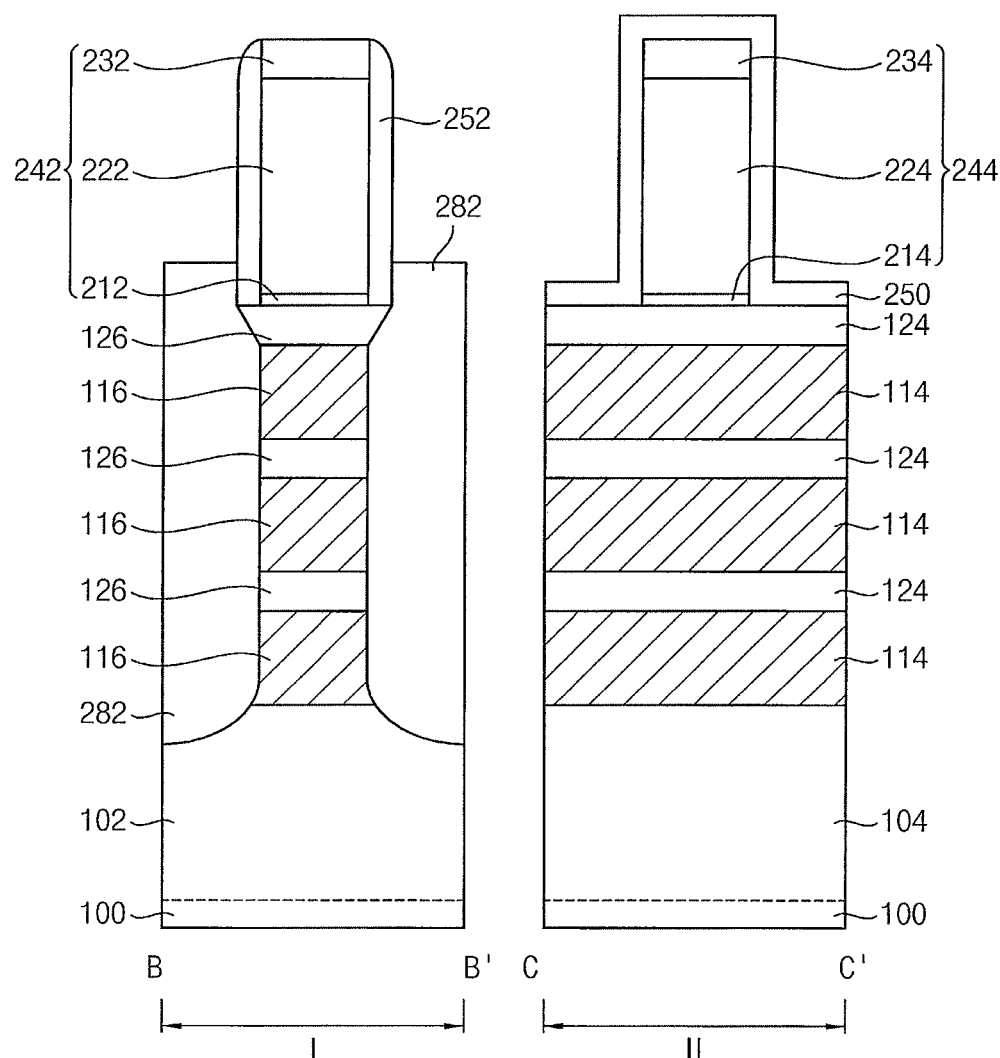
Figure 17:
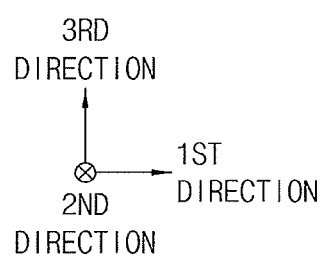
Figure 18:
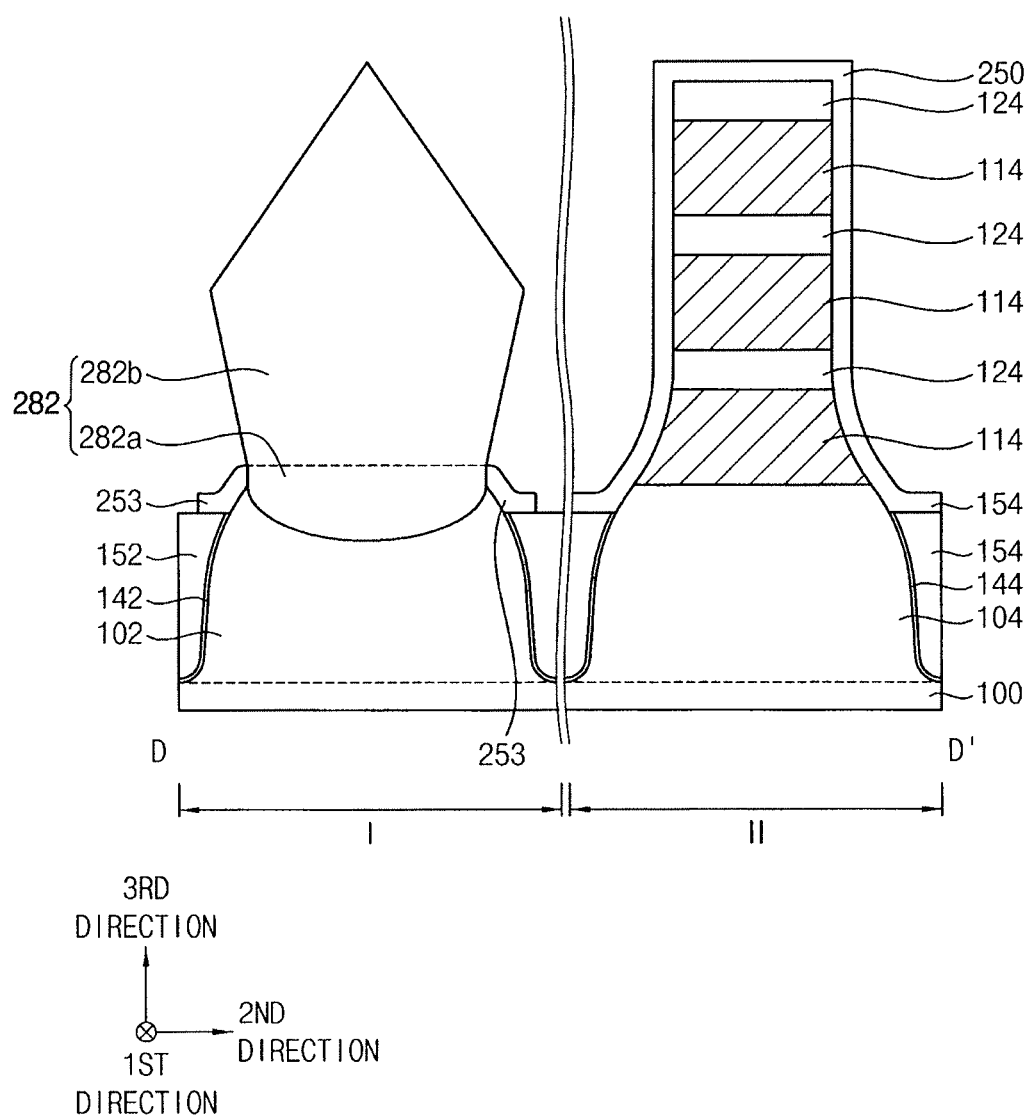

Referring to FIGS. 16 to 18, after removing the second photoresist pattern 260, the first source/drain layer 282 may be formed on the upper surface of the first active pattern 102 exposed by the first recess 272. In example embodiments, the first source/drain layer 282 may be formed by an SEG process using the exposed upper surface of the first active pattern 102 and sidewalls of the first semiconductor patterns 126 exposed by the first recess 272 as a seed.

In example embodiments, the SEG process may be performed, using a silicon source gas such as dichlorosilane ($SiH_2Cl_2$) gas and a germanium source gas such as germane ($GeH_4$) gas, to form a single crystalline silicon-germanium (SiGe) layer. The single crystalline silicon-germanium layer may be doped with p-type impurities and a heat treatment may be performed thereon. The first source/drain layer 282 may serve as a source/drain of a PMOS transistor.

In example embodiments, as illustrated in FIG. 17, the first source/drain layer 282 may be formed on each of opposite sidewalls of the third structure in the first direction, and may contact the sidewalls of the first semiconductor patterns 126 and an outer sidewall of the first gate spacer 252. As illustrated above, the first recess 272 may have the relatively large volume, and thus the first source/drain layer 282 filling the first recess 272 may have a relatively large volume.

As illustrated in FIG. 18, the first source/drain layer 282 may include lower and upper portions 282a and 282b sequentially stacked and connected with each other, and an interface between the lower and upper portions 282a and 282b may be at the height of the uppermost surface of the first fin spacer 253. In example embodiments, the lower portion 282a of the first source/drain layer 282 may have a cross-section in the second direction having a convex curved shape, e.g., a portion of an ellipse or circle. The upper portion 282b of the first source/drain layer 282 may have a cross-section in the second direction having a portion of a polygon, e.g., a pentagon or rectangle.

Figure 19:
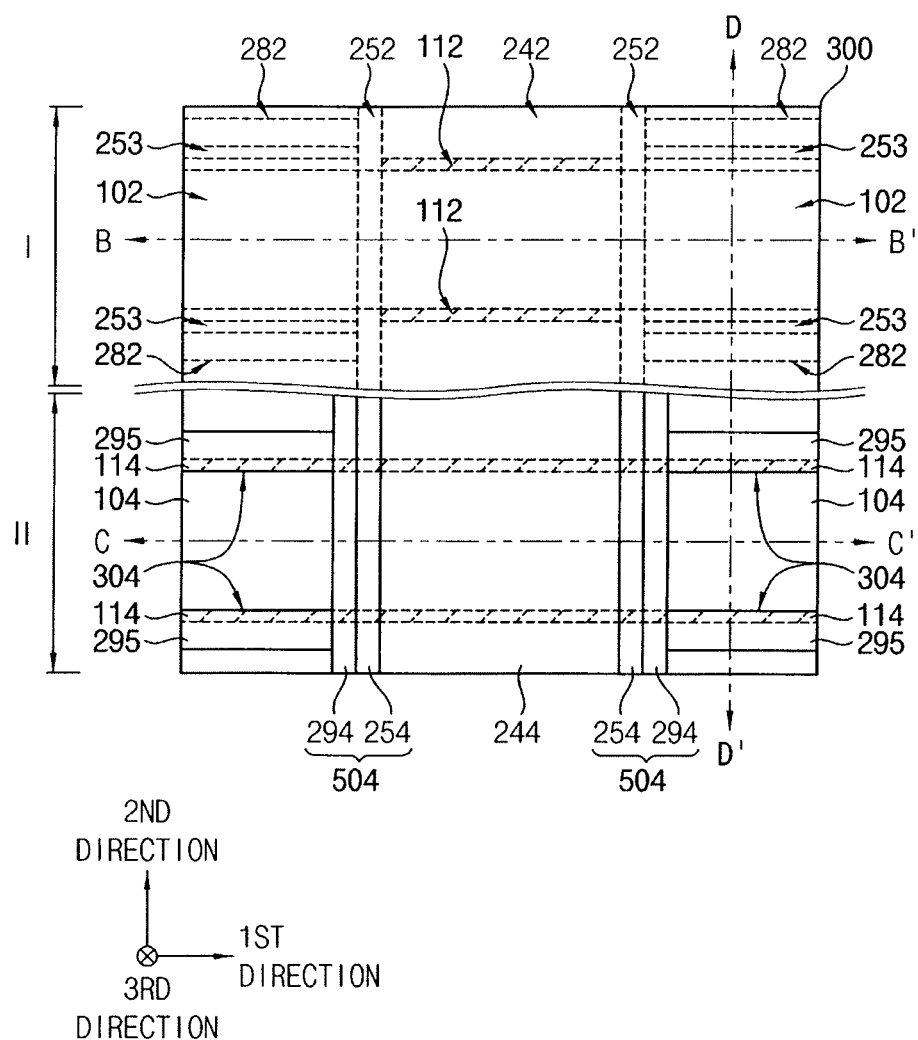
Figure 20:
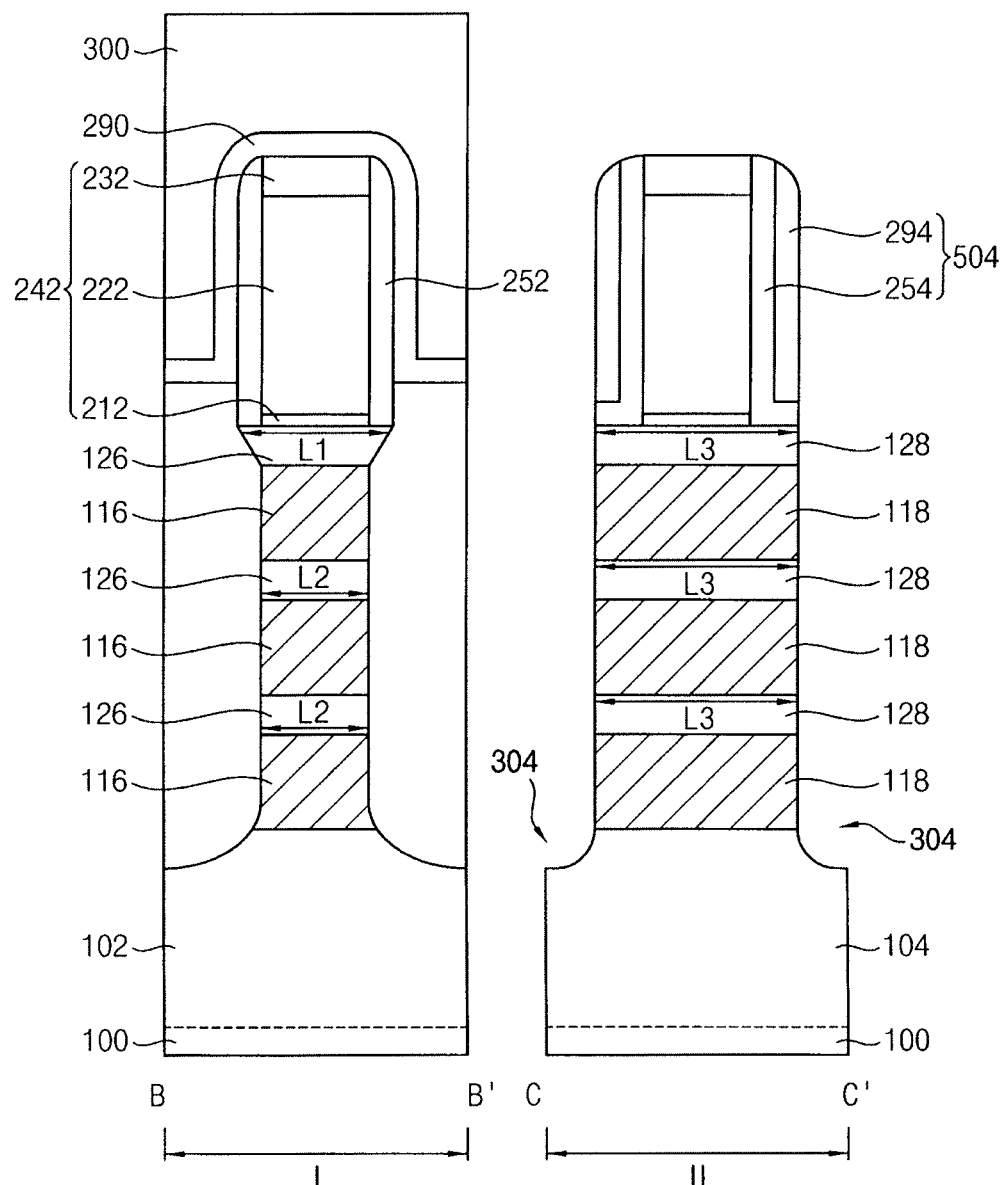
Figure 21:
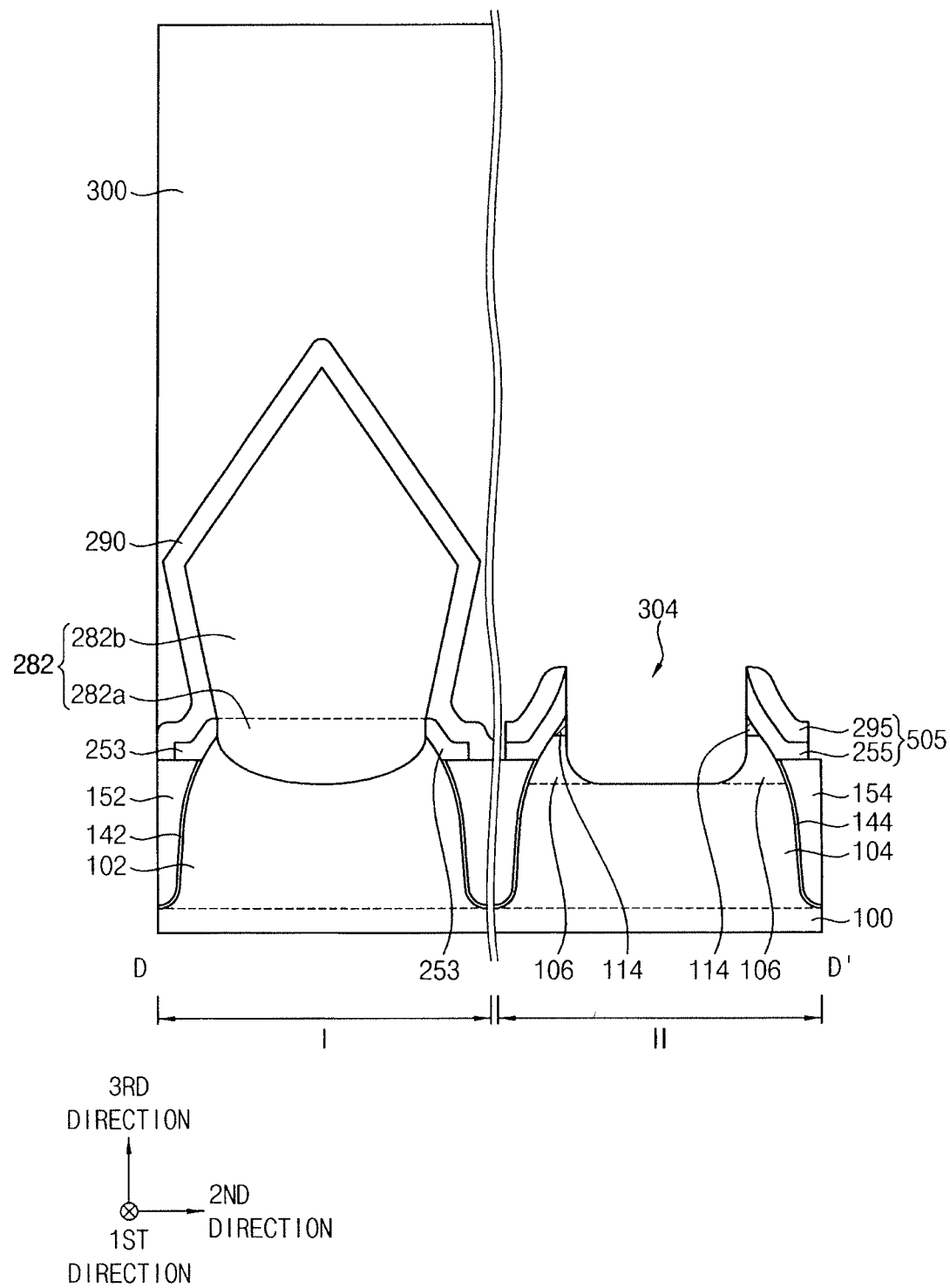

Referring to FIGS. 19 to 21, a second spacer layer 290 may be formed on the substrate 100 having the third structure, the first source/drain layer 282, the first fin spacer 253, the first isolation pattern 152, and the first spacer layer 250. A third photoresist pattern 300 covering the first region I of the substrate 100 may be formed on the second spacer layer 290, and a portion of the second spacer layer 290 on the second region II of the substrate 100 may be removed by an etching process using the third photoresist pattern 300 as an etching mask.

Thus, a fourth gate spacer 294 may be formed to cover each of opposite sidewalls of the first spacer layer 250 in the first direction on the second dummy gate structure 244, and a fourth fin spacer 295 may be formed on each of opposite sidewalls of the second fin structure in the second direction. The first spacer layer 250 may be anisotropically etched to form a third gate spacer 254 covering each of opposite sidewalls of the second dummy gate structure 244 in the first direction. A portion of the third gate spacer 254 under the fourth gate spacer 294 may remain, and thus the third gate spacer 254 may have a cross-section in the first direction having an "L" shape. The third and fourth gate spacers 254 and 294 sequentially stacked may form a second gate spacer structure 504.

During the anisotropical etching process, a third fin spacer 255 covering each of opposite sidewalls of the second fin structure in the second direction may be formed. The third and fourth fin spacers 255 and 295 sequentially stacked may form a second fin spacer structure 505.

The second fin structure may be etched using the second dummy gate structure 244 and the second gate spacer structure 504 as an etching mask to form a second recess 304 exposing an upper surface of the second active pattern 104. Thus, the second sacrificial lines 114 and the second semiconductor lines 124 under the second dummy gate structure 244 and the second gate spacer structure 504 may be transformed into second sacrificial patterns 118 and second semiconductor patterns 128, respectively, and the second fin structure extending in the first direction may be divided into a plurality of second fin structures spaced apart from each other in the first direction.

Hereinafter, the second dummy gate structure 244, the second gate spacer structure 504 and the second fin structure altogether may be referred to as a fourth structure. In example embodiments, the fourth structure may extend in the second direction, and a plurality of fourth structures may be spaced apart from each other in the first direction.

In example embodiments, the second recess 304 may have a vertical sidewall substantially perpendicular to the upper surface of the substrate 100 and aligned with an outer sidewall of the second gate spacer structure 504 in the third direction. Thus, a third length L3 in the first direction each of the second semiconductor patterns 128 may be constant along the third direction. In example embodiments, the third length L3 may be greater than the second length L2, and may be greater than a maximum value of the first length L1.

However, due to the characteristics of the etching process, the sidewall of the second recess 304 may not be perfectly perpendicular to the upper surface of the substrate 100, but a portion, e.g., a lower portion of the sidewall of the second recess 304 may be in a range of, e.g., about 80 degrees to 90 degrees. Thus, the length L3 in the first direction of each of the second semiconductor patterns 128, e.g., of a lowermost one of the second semiconductor patterns 128 may increase around a bottom surface thereof.

As the second recess 304 may have the vertical sidewall, even if most of the second sacrificial lines 114 and the second semiconductor lines 124 at opposite sides of the second dummy gate structure 244 in the first direction are removed during the etching process, the lowermost one of the second sacrificial lines 114 having a relatively large width in the first direction may not be entirely removed. Most of the second fin spacer structure 505 may be removed during the etching process, however, a portion of the second fin spacer structure 505 covering an upper portion of each of opposite sidewalls of the second active pattern 104 in the second direction may remain. The remaining second fin spacer structure 505 may include the third and fourth fin spacers 255 and 295 sequentially stacked. The second fin spacer structure 505 may be used for controlling a horizontal width of the second source/drain layer 334 (refer to FIGS. 24 to 26), and a height of an uppermost surface of the second fin spacer structure 505 remaining after the etching process may be adjusted so that the second source/drain layer 334 may have a desired width.

In example embodiments, the second recess 304 may have a lower surface that may be substantially flat except for opposite edges in the second direction, and a corresponding portion of the second active pattern 104 may have an upper surface that may be substantially flat. However, portions of the second active pattern 104 not overlapping the second dummy gate structure 244 and the second gate spacer structure 504 in the third direction may have first protrusions 106 protruding from the edges in the second direction, and an upper surface of a portion of the second active pattern 104 between the first protrusions 106 may be substantially flat.

In example embodiments, the second sacrificial line 114 may remain on the first protrusion 106 of the second active pattern 104 after the etching process, and the second recess 304 may expose an inner sidewall of the first protrusion 106 and an inner sidewall of the second sacrificial line 114. The second fin spacer structure 505 may cover an outer sidewall of the first protrusion 106 of the second active pattern 104 and an outer sidewall of the second sacrificial line 114.

Figure 22A:
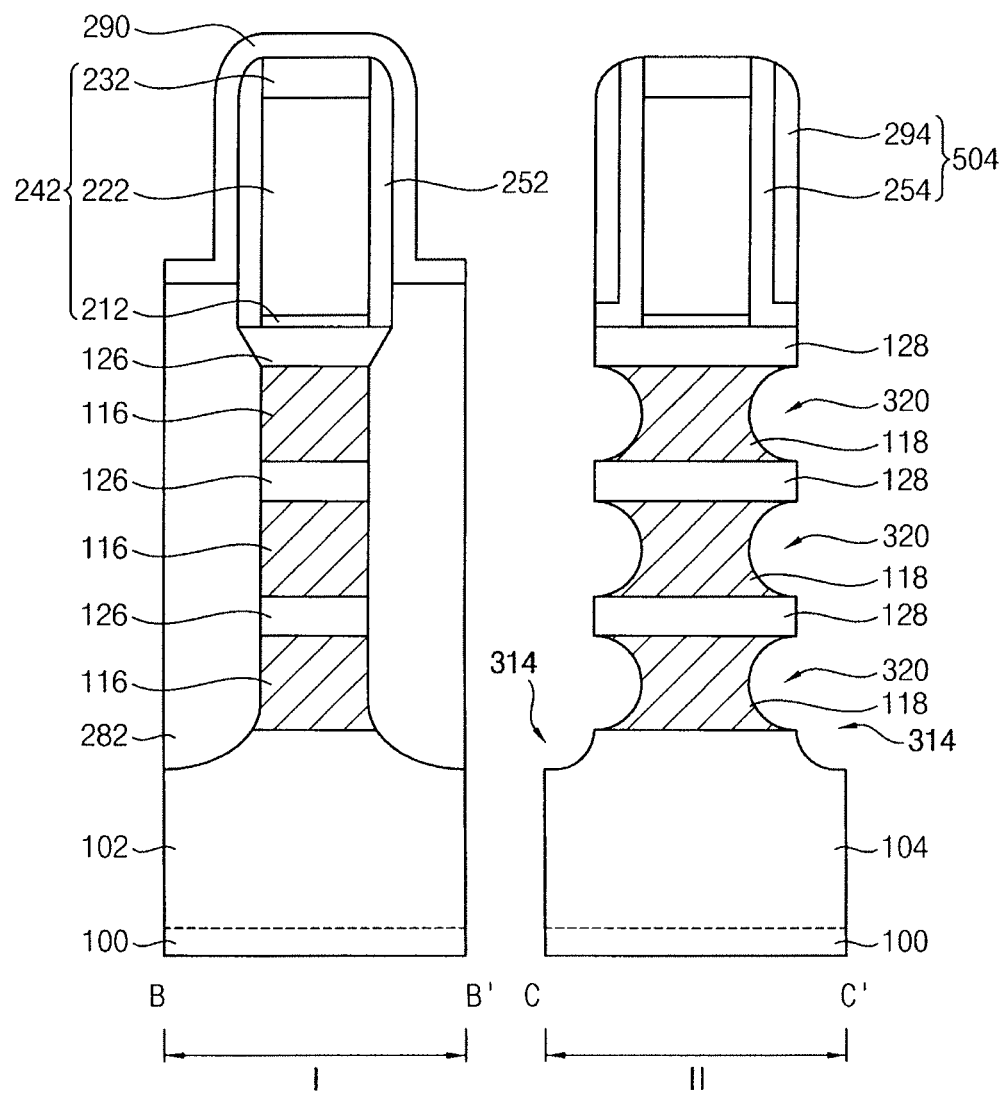

For example, referring to FIG. 22A, after removing the third photoresist pattern 300, each of opposite sidewalls of each of the second sacrificial patterns 118 in the first direction exposed by the second recess 304 may be etched to form a third recess 320. In example embodiments, the third recess 320 may be formed by a wet etching process on the second sacrificial patterns 118. In example embodiments, the third recess 320 may have a cross-section in the first direction that may have a shape of a semicircle.

Figure 22B:
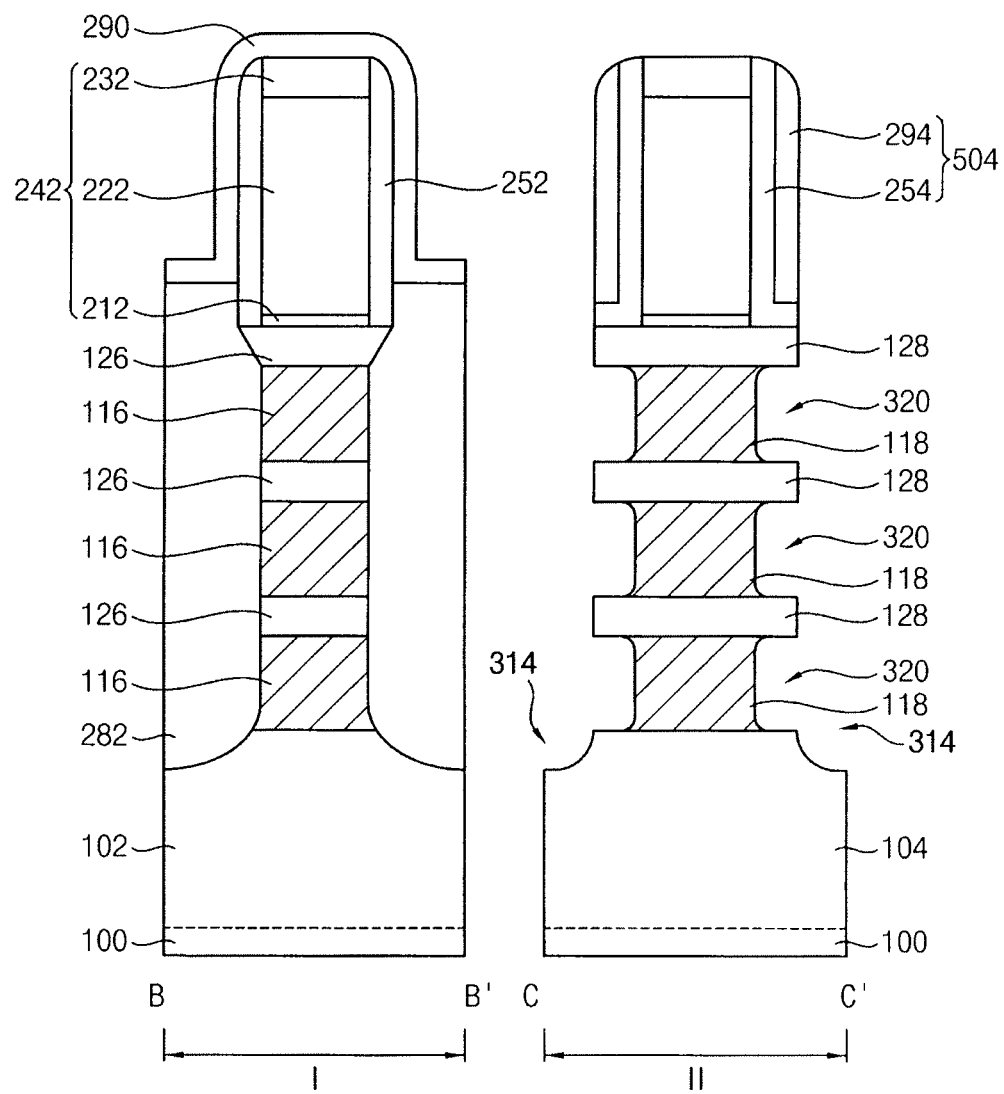

In another example, referring to FIG. 22B, the third recess 320 may have a cross-section in the first direction that may have a shape of a rounded rectangle in which edges of a sidewall facing the second sacrificial pattern 118 is rounded.

Figure 23A:
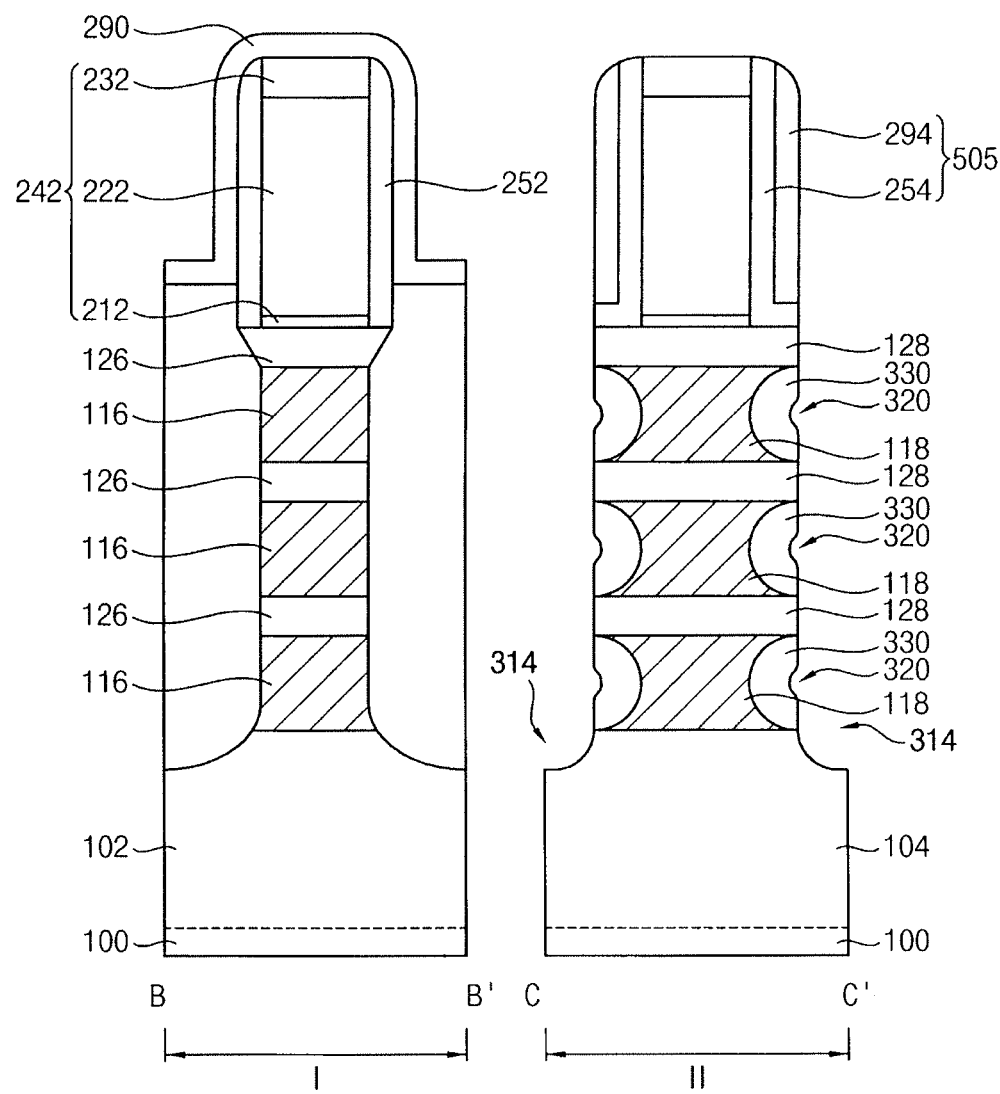

For example, referring to FIG. 23A, an inner spacer 330 may be formed in the third recess 320. In example embodiments, the inner spacer 330 may be formed by forming a third spacer layer to fill the third recess 320 on the substrate 100, and anisotropically etching the third spacer layer. Thus, the inner spacer 330 may cover each of opposite sidewalls of each of the second sacrificial patterns 118 in the first direction, and a central portion in the third direction of an outer sidewall of the inner spacer 330 may be concave. In example embodiments, the inner spacer 330 may have a cross-section in the first direction that may have a horseshoe shape or a shape of a semicircle having a recess on an outer sidewall thereof.

Figure 23B:
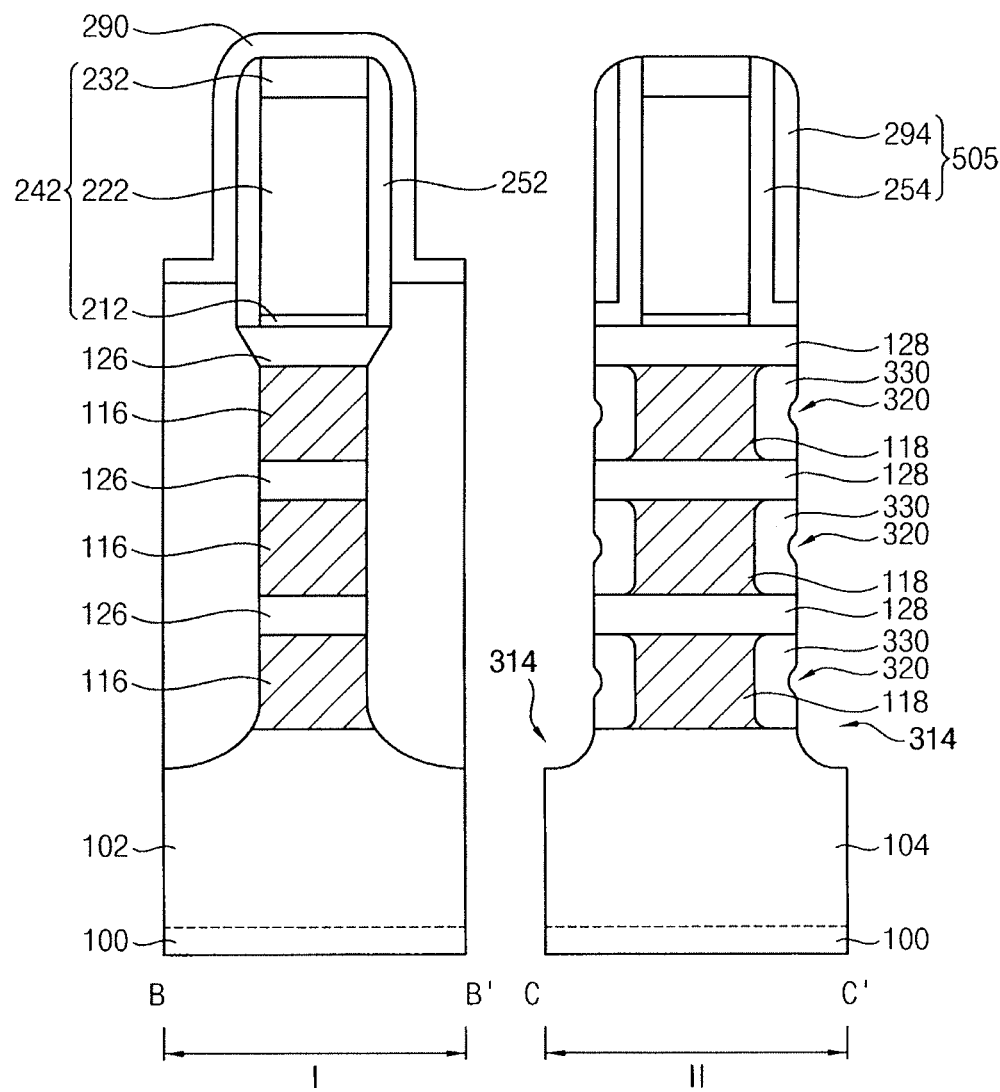

In another example, referring to FIG. 23B, the inner spacer 330 may have a cross-section in the first direction that may have a shape of a rounded rectangle having a recess on an outer sidewall thereof.

Figure 24:
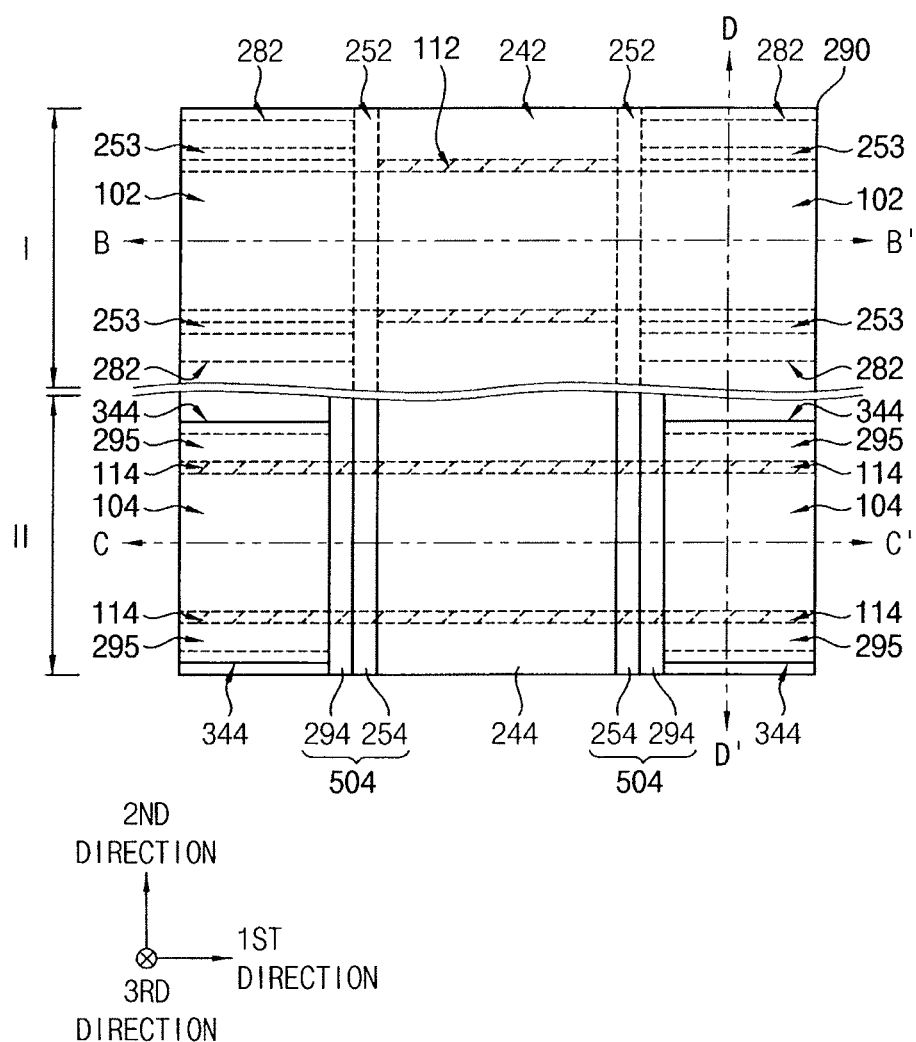
Figure 25:
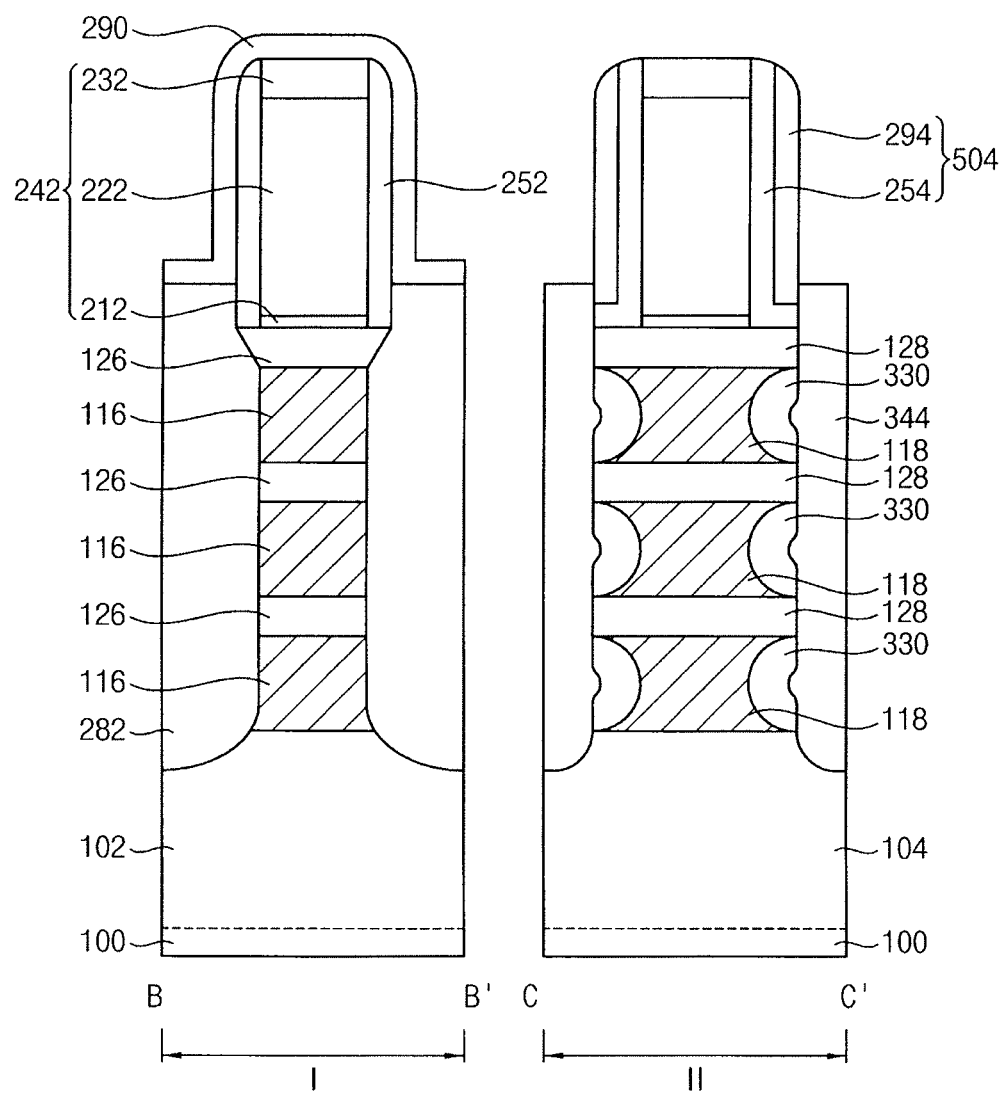
Figure 26:
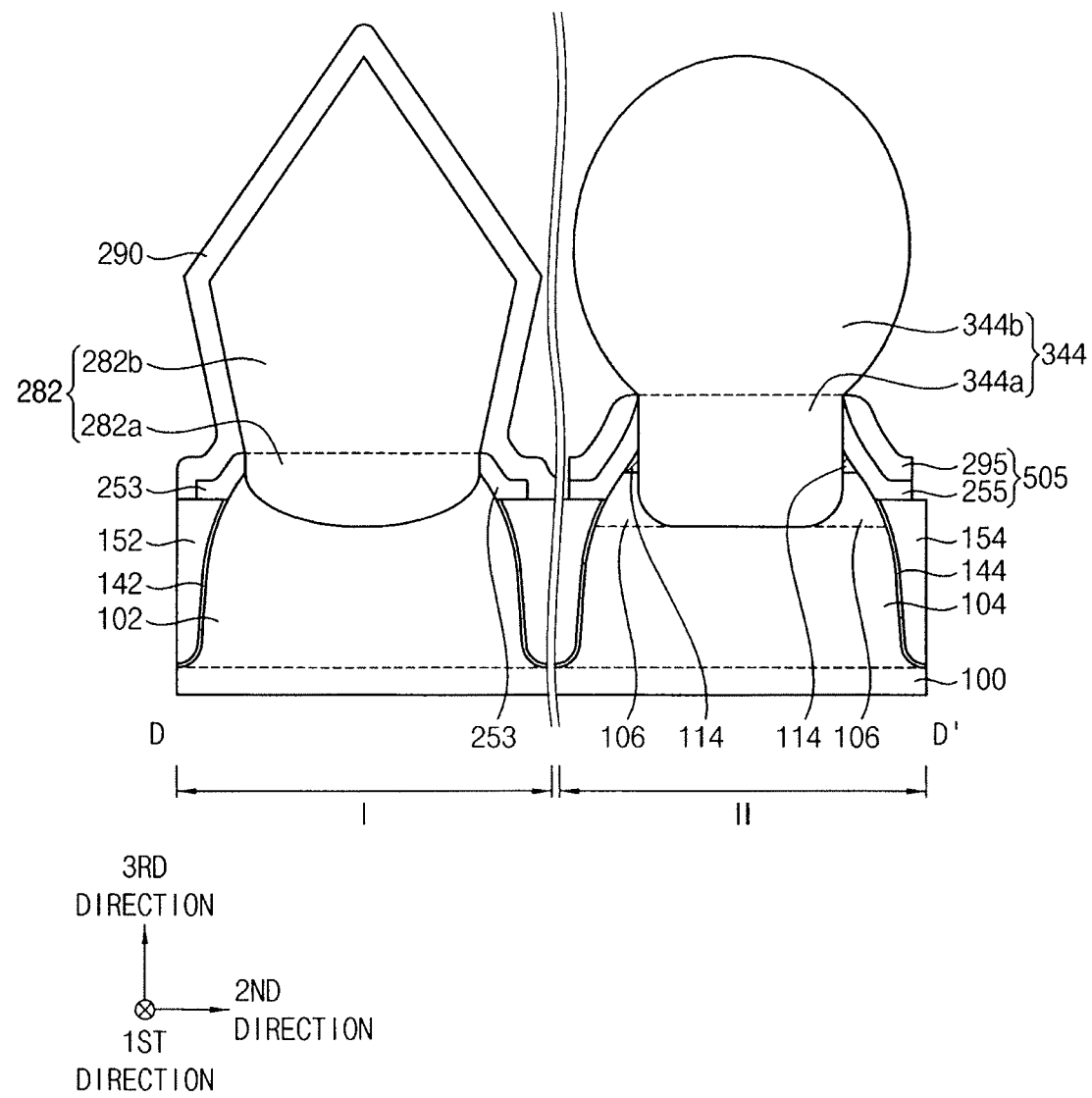

Referring to FIGS. 24 to 26, a second source/drain layer 344 may be formed on the upper surface of the second active pattern 104 exposed by the second recess 304. In example embodiments, the second source/drain layer 344 may be formed by an SEG process using the upper surface of the second active pattern 104 and sidewalls of the second semiconductor patterns 128 exposed by the second recess 304 as a seed.

In example embodiments, the SEG process may be performed using a silicon source gas such as disilane ($Si_2H_6$) to form a single crystalline silicon layer. Alternatively, the SEG process may be performed using the silicon source gas such as disilane ($Si_2H_6$) and a carbon source gas such as $SiH_3CH_3$, to form a single crystalline silicon carbide (SiC) layer. The single crystalline silicon layer or the single crystalline silicon carbide layer may be doped with n-type impurities, and a heat treatment may be performed thereon. The second source/drain layer 344 may serve as a source/drain of an NMOS transistor.

In example embodiments, the second source/drain layer 344 may be formed at each of opposite sidewalls of the fourth structure in the first direction, and may contact the sidewalls of the second semiconductor patterns 128 and an outer sidewall of the second gate spacer structure 504.

The second source/drain layer 344 may include lower and upper portions 344a and 344b sequentially stacked and connected with each other, and an interface between the lower and upper portions 344a and 344b may be at a height of the uppermost surface of the second fin spacer structure 505. In example embodiments, the lower portion 344a of the second source/drain layer 344 may have a cross-section in the second direction having a "U" shape. The upper portion 344b of the second source/drain layer 344 may have a cross-section in the second direction having various shapes, e.g., a shape of an ellipse.

Figure 27:
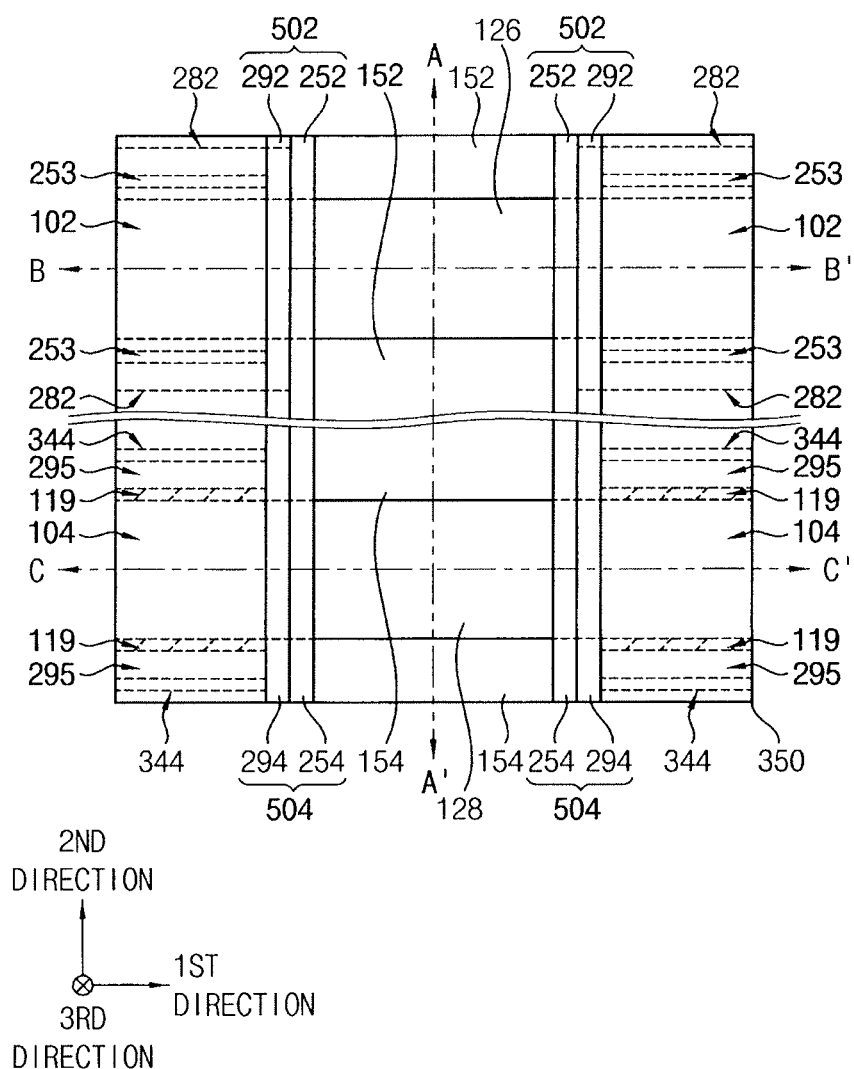
Figure 28:
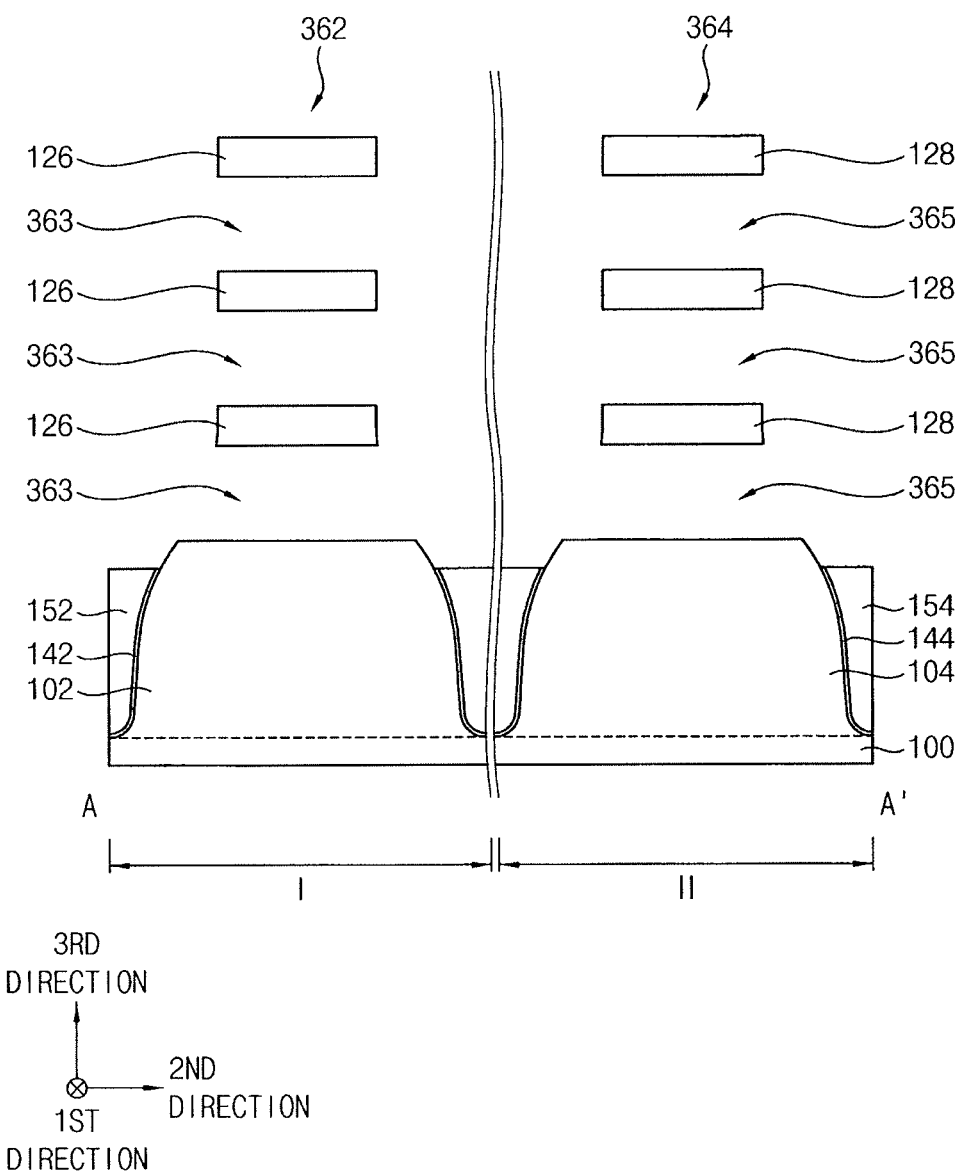
Figure 29:
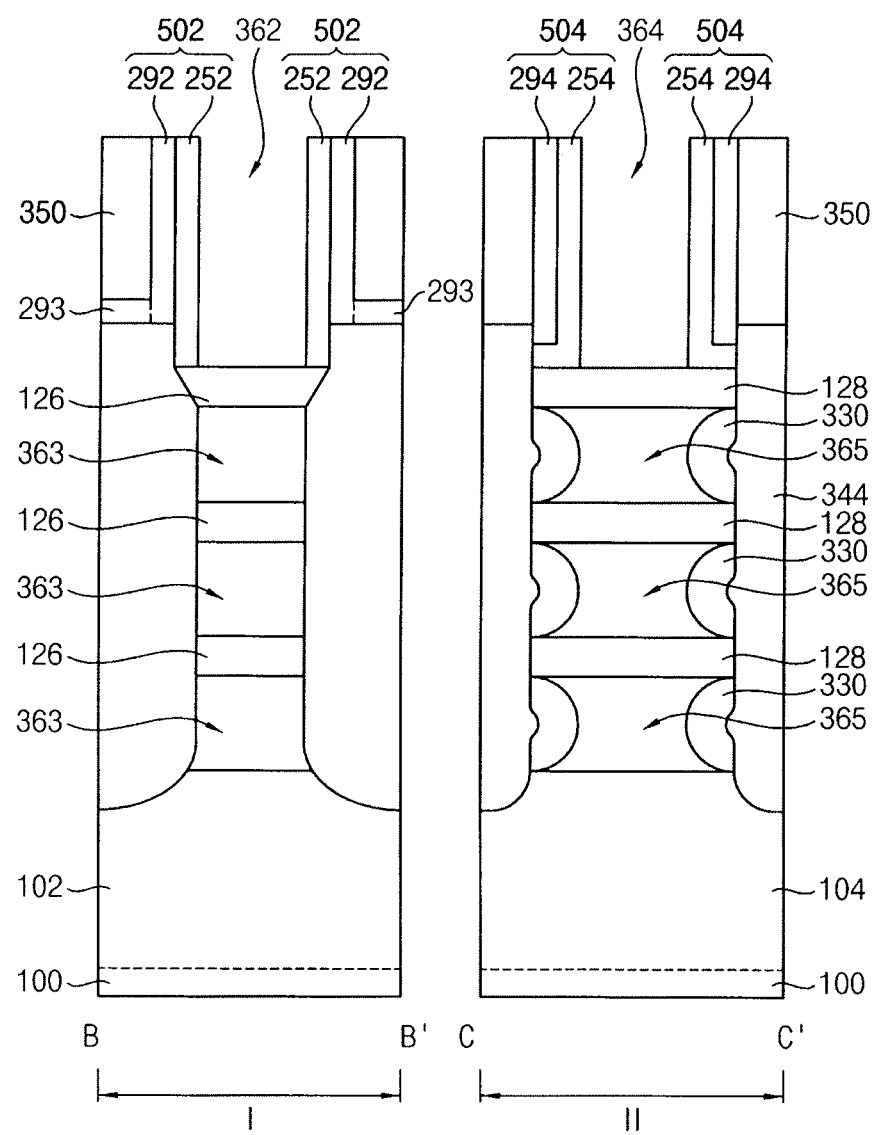

Referring to FIGS. 27 to 29, an insulation layer 350 may be formed on the second isolation pattern 154 and the second liner 144 to cover the third and fourth structures, the second fin spacer structure 505, the second spacer layer 290, and the first and second source/drain layers 282 and 334, and may be planarized until upper surfaces of the first and second dummy gate electrodes 222 and 224 of the respective third and fourth structures may be exposed. The planarization process may be performed by a CMP process and/or an etch back process.

During the planarization process, the first and second dummy gate masks 232 and 234 may be also removed, and upper portions of the first gate spacer 252, the second spacer layer 290 and the second gate spacer structure 504 may be partially removed.

The second spacer layer 290 of which the upper portion has been removed may form a second gate spacer 292 on an outer sidewall of the first gate spacer 252, and the second spacer layer 290 may also cover surfaces of the first fin spacer 253 and the first source/drain layer 282, which may be referred to as a second fin spacer 293 hereinafter. The second fin spacer 293 may also cover an upper surface of the first isolation pattern 152 adjacent the first source/drain layer 282 in the second direction.

The first and second gate spacers 252 and 292 sequentially stacked on each of opposite sidewalls of the first dummy gate structure 242 in the first direction may form a first gate spacer structure 502, and the first and second fin spacers 253 and 293 sequentially stacked on an upper portion of each of opposite sidewalls of the first active pattern 102 in the second direction may form a first fin spacer structure 503.

The exposed first and second dummy gate electrodes 222 and 224 and the first and second dummy gate insulation patterns 212 and 214 thereunder may be removed to form first and second openings 362 and 364 exposing upper surfaces of the uppermost ones of the first and second semiconductor patterns 126 and 128, respectively. The first and second dummy gate electrodes 222 and 224 may be removed by, e.g., a wet etching process.

The first sacrificial patterns 116 may be removed to form a third opening 363 exposing surfaces of the first semiconductor patterns 126 and the upper surface of the first active pattern 102, and to form a fourth opening 365 exposing inner sidewalls of the inner spacers 330, surfaces of the second semiconductor patterns 126 and the upper surface of the first active pattern 102.

When the first sacrificial patterns 116 are removed, a portion of the second sacrificial line 114 remaining on the second region II of the substrate 100 and overlapping the fourth structure in the third direction may be also removed. Thus, the second sacrificial line 114 extending in the first direction may be divided into a plurality of third sacrificial patterns 119 spaced apart from each other in the first direction.

Referring to FIGS. 1 to 4 again, a first gate structure 412 may be formed on the first region I of the substrate 100 to fill the first and third openings 362 and 363, and a second gate structure 414 may be formed on the second region II of the substrate 100 to fill the second and fourth openings 364 and 365.

Particularly, after a thermal oxidation process is performed on the upper surfaces of the first and second active patterns 102 and 104 and the surfaces of the first and second semiconductor patterns 126 and 128 exposed by the first to fourth openings 362, 364, 363 and 365 to form first and second interface patterns 372 and 374, a gate insulation layer and a workfunction control layer may be sequentially formed on surfaces of the first and second interface patterns 372 and 374, the inner sidewalls of the inner spacers 330, inner sidewalls of the first and second spacer structures 502 and 504, and an upper surface of the insulation layer 350, and a gate electrode layer may be formed to fill a remaining portion of the first to fourth openings 362, 364, 363 and 365.

The gate insulation layer, the workfunction control layer, and the gate electrode layer may be formed by, e.g., a CVD process, an ALD process, a PVD process, etc. The first and second interface patterns 372 and 374 may be also formed by a CVD process, an ALD process, a PVD process, etc., instead of the thermal oxidation process, and in this case, each of the first and second interface patterns 372 and 374 may be also formed on the inner sidewalls of the inner spacers 330 and the inner sidewalls of the first and second spacer structures 502 and 504.

The gate electrode layer, the workfunction control layer, and the gate insulation layer may be planarized until the upper surface of the insulation layer 350 may be exposed to form first and second gate electrodes 402 and 404, first and second workfunction control patterns 392 and 394, and first and second gate insulation patterns 382 and 384, respectively. The first interface pattern 372, the first gate insulation pattern 382, the first workfunction control pattern 392, and the first gate electrode 402 may form the first gate structure 412, and the second interface pattern 374, the second gate insulation pattern 384, the second workfunction control pattern 394, and the second gate electrode 404 may form the second gate structure 414.

The semiconductor device may be manufactured by the above processes. As illustrated above, the first source/drain layer 282 may have the relatively large width in the first direction, and thus the lowermost one of the first sacrificial patterns 116 may not remain, while the lowermost one of the second sacrificial patterns 118 may remain.

Figure 30:
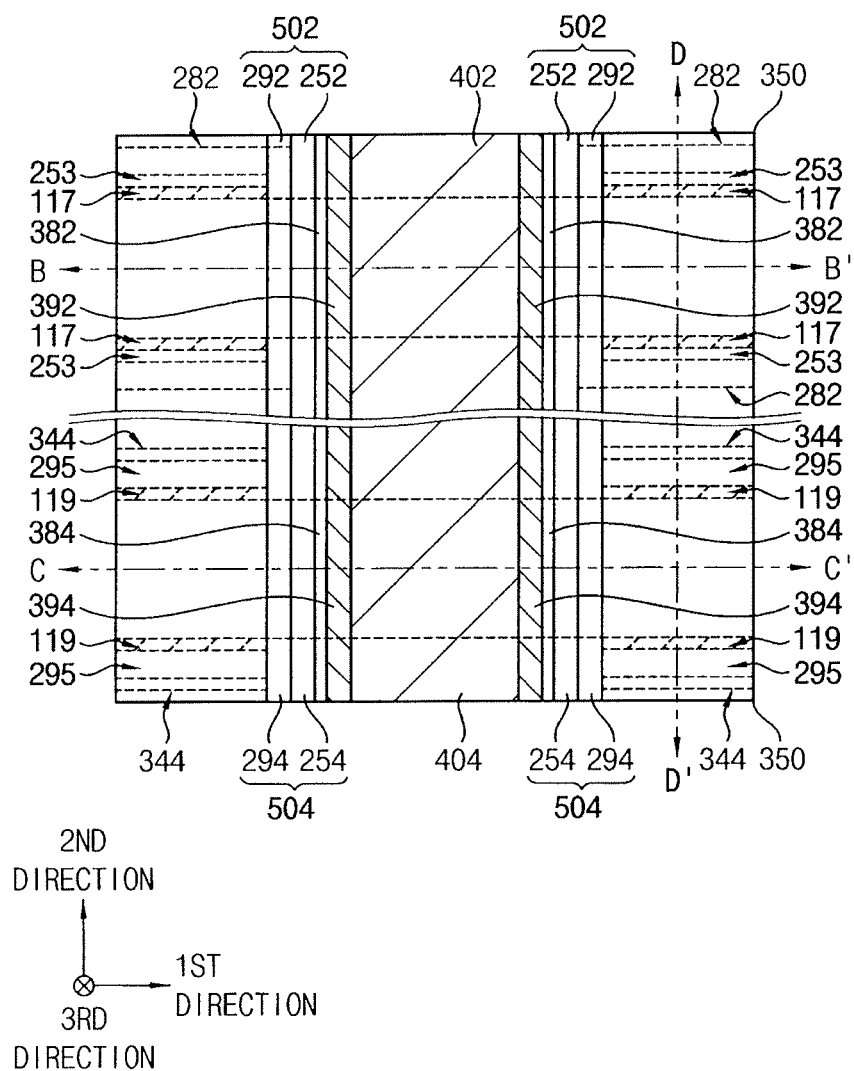
FIGS. 30 to 32 illustrate a plan view and cross-sectional views of a semiconductor device in accordance with example embodiments.
Figure 31:
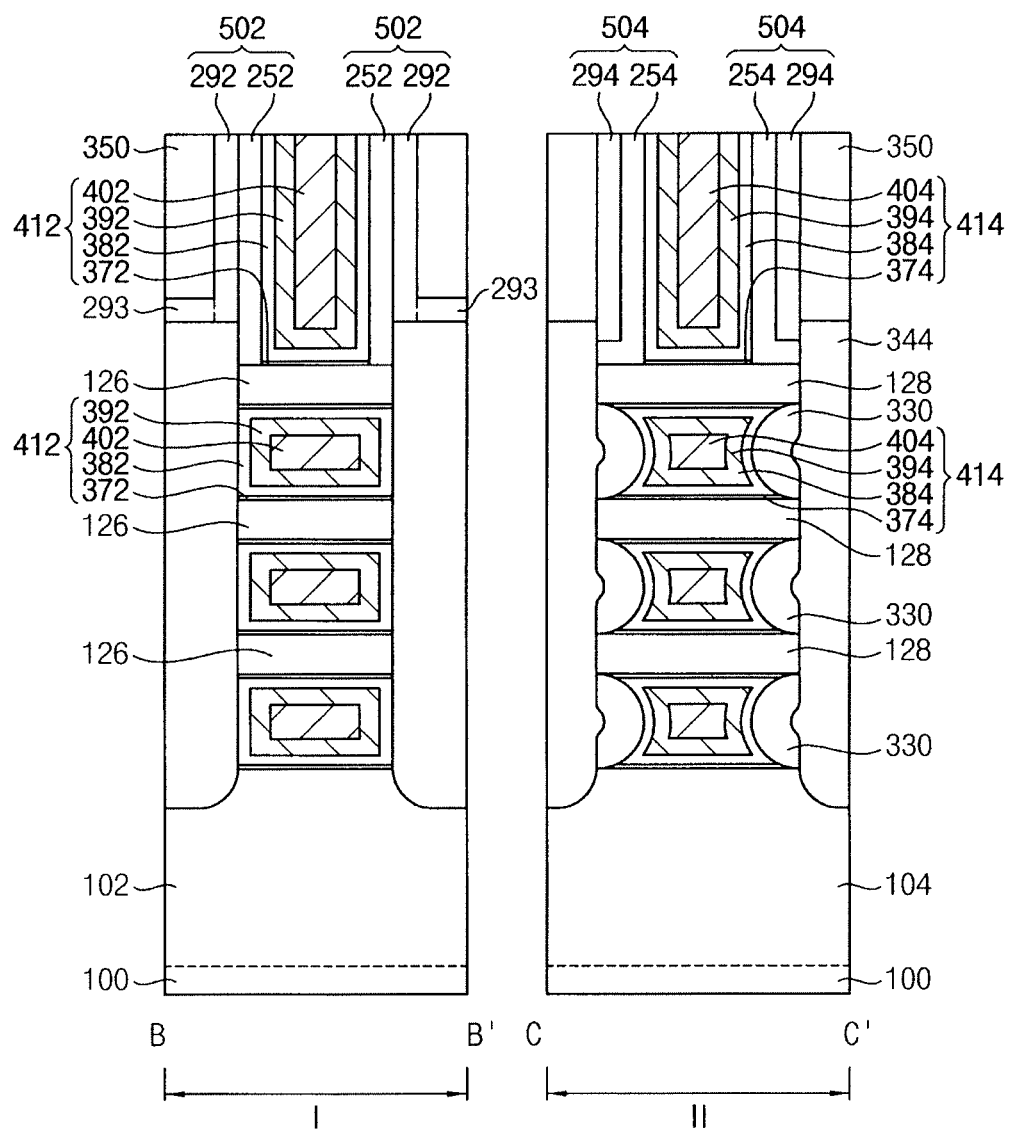
Figure 32:
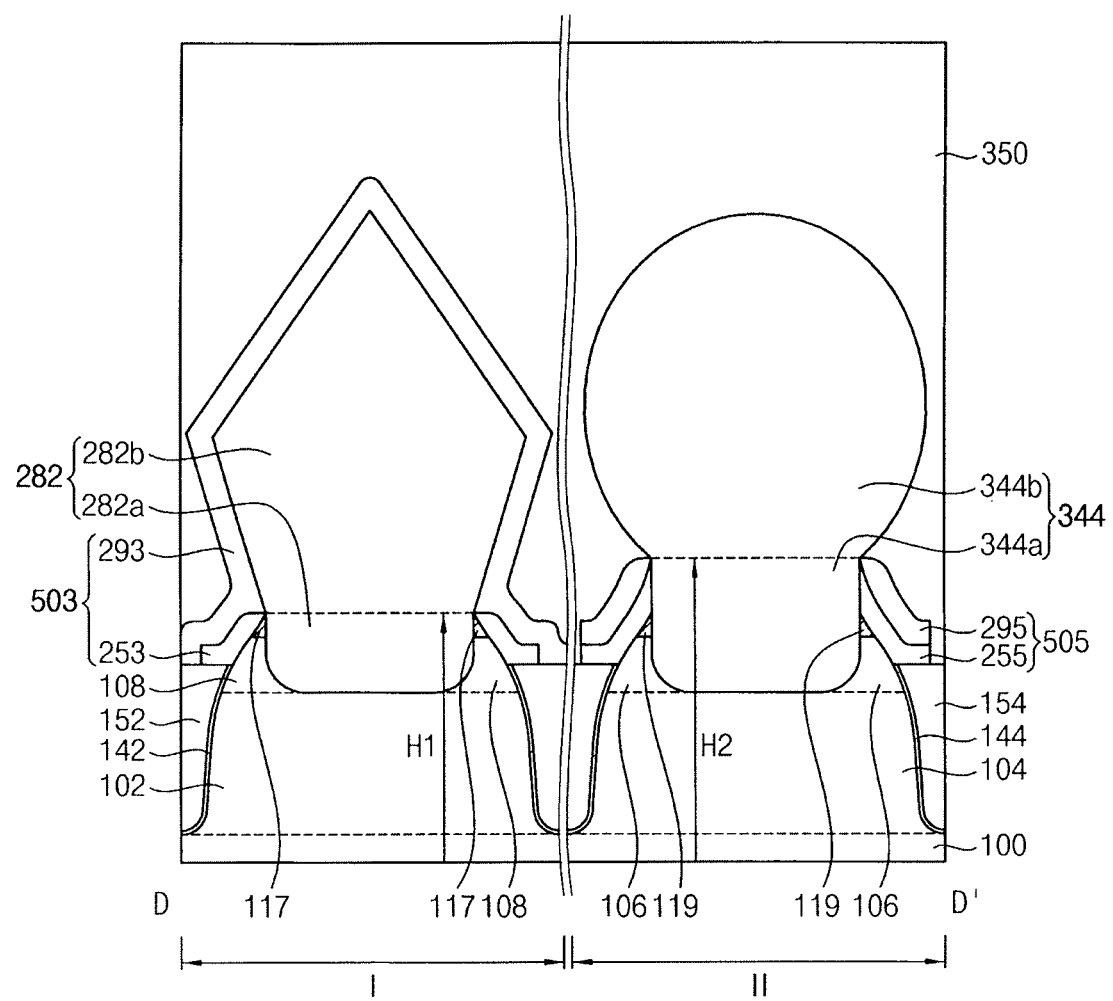

FIGS. 30 to 32 are a plan view and cross-sectional views illustrating a semiconductor device in accordance with example embodiments. FIG. 30 is the plan view, FIG. 31 includes cross-sections taken along lines B-B' and C-C', respectively, of FIG. 30, and FIG. 32 is a cross-sectional view taken along a line D-D' of FIG. 30. This semiconductor device may be substantially the same as that of FIGS. 1 to 5, except for some elements. Thus, like reference numerals refer to like elements, and detailed descriptions thereon are omitted herein.

Referring to FIGS. 30 to 32, a portion of the first active pattern 102 not overlapping the first gate structure 412 and the first gate spacer 252 in the third direction may include second protrusions 108 protruding upwardly from opposite edges, respectively, in the second direction, and an upper surface of a portion of the second active pattern 104 between the second protrusions 108 may be flat.

An inner sidewall of the second protrusion 108 of the first active pattern 102 may contact the first source/drain layer 282, and an outer sidewall of the second protrusion 108 of the first active pattern 102 may contact the first fin spacer 253. That is, a bottom surface of the second protrusion 108 may be substantially coplanar with the lower surface of the first source/drain layer 282, which may be substantially flat between the second protrusions 108 neighboring in the second direction.

In example embodiments, the lower portion 282b of the first source/drain layer 282 may have a cross-section of a "U" shape.

In example embodiments, a fourth sacrificial pattern 117 may be formed on the second protrusion 108 of the first active pattern 102. An inner sidewall of the fourth sacrificial pattern 117 may be covered by a sidewall of the lower portion 282a of the first source/drain layer 282, and an outer sidewall of the fourth sacrificial pattern 117 may be covered by the first fin spacer 253. In example embodiments, a bottom surface of the fourth sacrificial pattern 117 may be higher than a bottom surface of the first source/drain layer 282.

The fourth sacrificial pattern 117 may extend in the first direction in an area not overlapping the first gate structure 412 and the first gate spacer structure 502. In some embodiments, the fourth sacrificial pattern 117 may partially overlap the first gate spacer structure 502 in the third direction.

Figure 33:
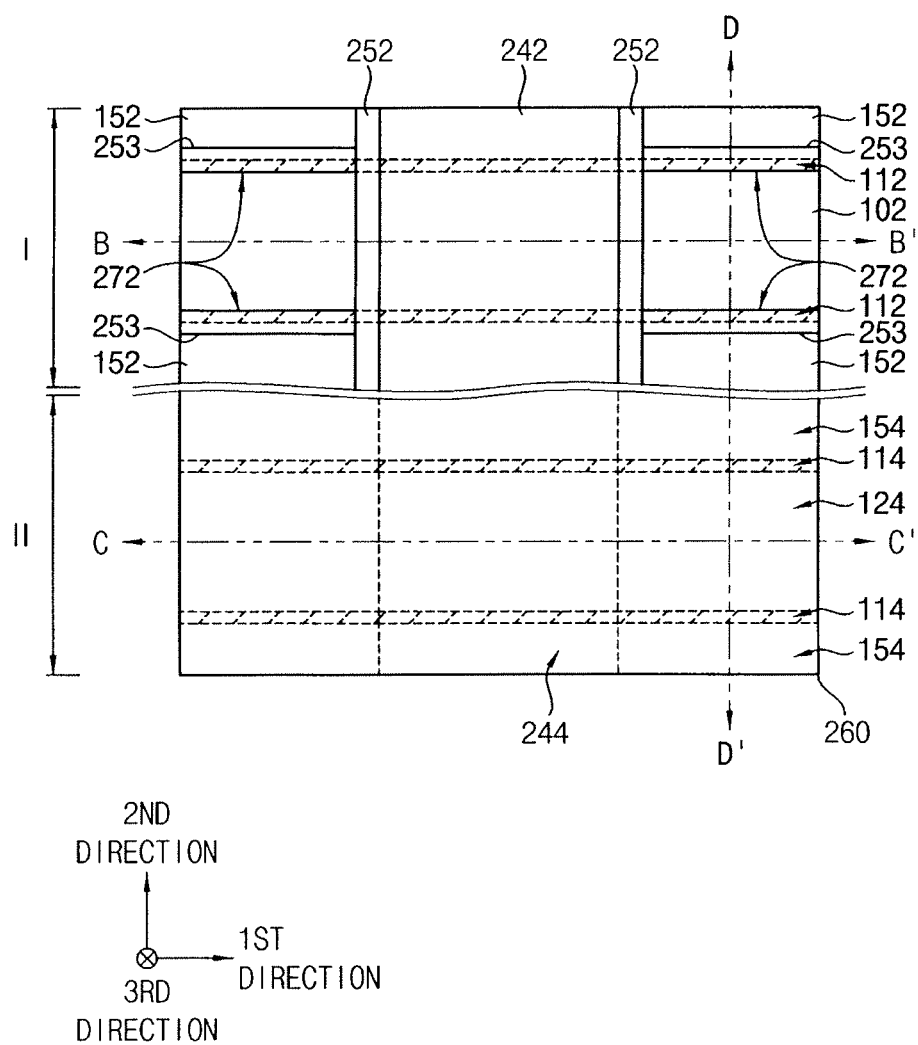
FIGS. 33 to 35 illustrate plan and cross-sectional views of stages in a method of manufacturing a semiconductor device in accordance with example embodiments.
Figure 34:
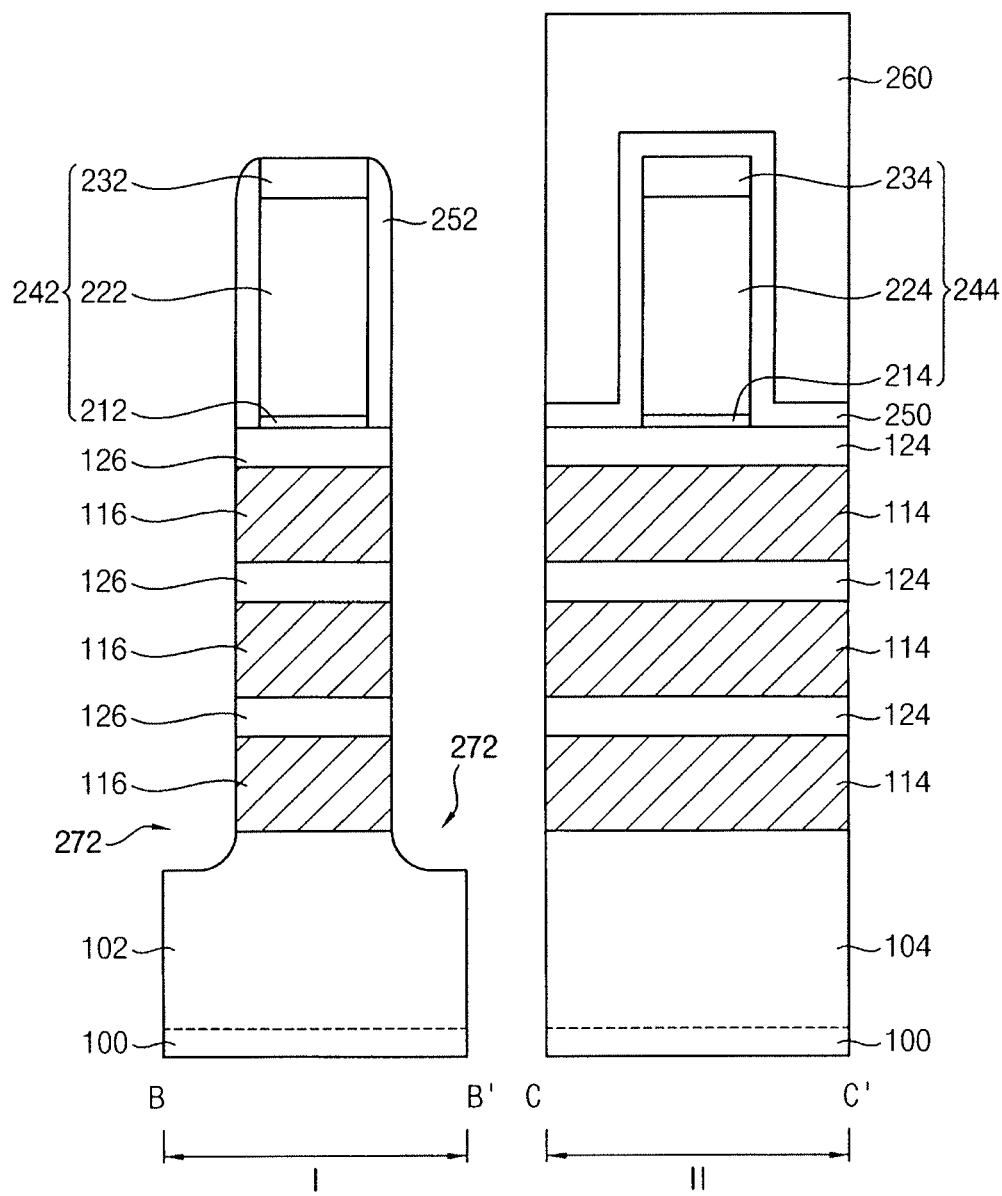
Figure 35:
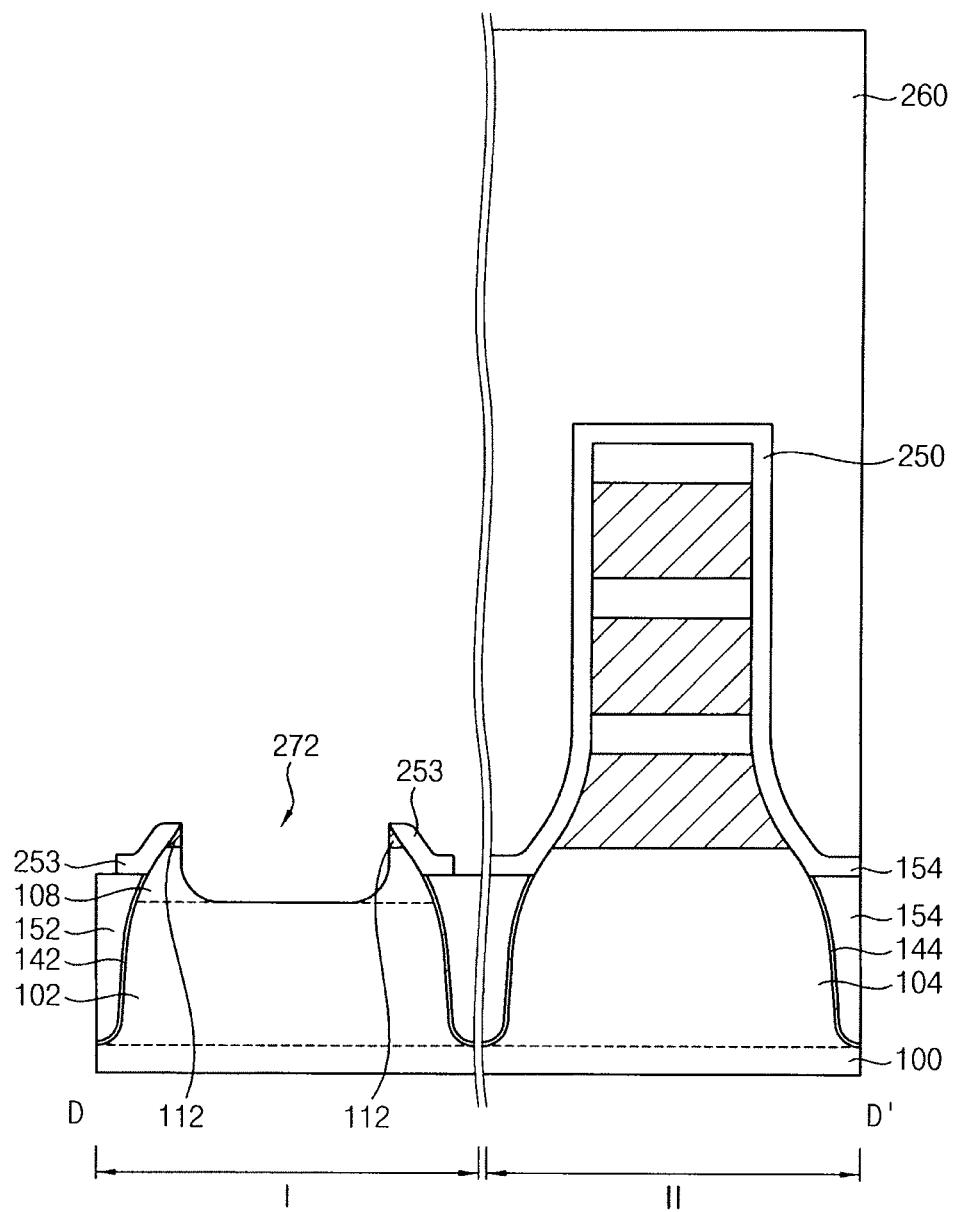

FIGS. 33 to 35 are a plan view and cross-sectional views illustrating a method of manufacturing a semiconductor device in accordance with example embodiments. Particularly, FIG. 33 is the plan view, FIG. 34 includes cross-sections taken along lines B-B' and C-C', respectively, of FIG. 33, and FIG. 35 is a cross-sectional view taken along a line D-D' of FIG. 33. This method may include processes substantially the same as or similar to those illustrated with reference to FIGS. 5 to 29 and FIGS. 1 to 4, and thus repetitive explanations thereon are omitted herein.

Referring to FIGS. 33 to 35, processes substantially the same as or similar to those illustrated with reference to FIGS. 5 to 15 may be performed.

However, the first recess 272 formed by an etching process may have a vertical sidewall that may be substantially perpendicular to the upper surface of the substrate 100 and aligned with the outer sidewall of the first gate spacer 252. Thus, when the first sacrificial lines 112 and the first semiconductor lines 122 at opposite sides of the first dummy gate structure 242 and the first gate spacer 252 in the first direction are removed, the lowermost one of the first sacrificial lines 112 having a relatively large width in the first direction may not be entirely removed. For example, the first recess 272 may have a cross-section of a "U" shape.

Processes substantially the same as or similar to those illustrated with reference to FIGS. 16 to 29 and FIGS. 1 to 4 may be performed to complete the fabrication of the semiconductor device.

By way of summation and review, example embodiments provide a semiconductor device having enhanced characteristics. That is, in the semiconductor device in accordance with example embodiments, the source/drain layer of the PMOS transistor may have a relatively large crystal lattice and a relatively large volume when compared to those of the channels thereof. Thus, a strong compressive stress may be applied to the channels so as to enhance the mobility of charges in the channels. The channels of the NMOS transistor may have a relatively long constant length, and thus the characteristics of the NMOS transistor may have enhanced electric characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate including a first region and a second region;
    a first transistor including:
        a first active pattern on the first region of the substrate, the first active pattern extending in a first direction parallel to an upper surface of the substrate,
        a first gate structure on the first active pattern, the first gate structure extending in a second direction parallel to the upper surface of the substrate and crossing the first direction,
        first channels spaced apart from each other in a third direction perpendicular to the upper surface of the substrate, each of the first channels extending partially through the first gate structure, and
        a first source/drain layer on a portion of the first active pattern at each of opposite sides of the first gate structure in the first direction, the first source/drain layer contacting the first channels; and
    a second transistor including:
        a second active pattern on the second region of the substrate, the second active pattern extending in the first direction,
        a second gate structure on the second active pattern, the second gate structure extending in the second direction,
        second channels spaced apart from each other in the third direction, each of the second channels extending partially through the second gate structure, and
        a second source/drain layer on a portion of the second active pattern at each of opposite sides of the second gate structure in the first direction, the second source/drain layer contacting the second channels,
    wherein the portion of the first active pattern has an upper surface having a concave curved shape, and
    wherein the portion of the second active pattern includes protrusions protruding upwardly in the third direction at respective opposite edges thereof in the second direction, a sacrificial pattern being positioned on each of the protrusions to contact a sidewall of the second source/drain layer.

2. The semiconductor device as claimed in claim 1, wherein the portion of the second active pattern has an upper surface that is flat between the protrusions thereof.

3. The semiconductor device as claimed in claim 1, wherein each of the first channels and each of the second channels includes silicon, and the sacrificial pattern includes silicon-germanium.

4. The semiconductor device as claimed in claim 1, further comprising a fin spacer structure contacting the protrusions of the second active pattern and the sacrificial pattern.

5. The semiconductor device as claimed in claim 4, wherein:
the second source/drain layer includes lower and upper portions below and above, respectively, a height of an uppermost surface of the fin spacer structure, and
the lower portion of the second source/drain layer has a cross-section in the second direction having a "U" shape, and the upper portion of the second source/drain layer has a cross-section in the second direction having a shape of an ellipse.

6. The semiconductor device as claimed in claim 4, wherein the fin spacer structure contacts a portion of the second source/drain layer.

7. The semiconductor device as claimed in claim 4, wherein the fin spacer structure includes first and second fin spacers sequentially stacked.

8. The semiconductor device as claimed in claim 7, wherein each of the first and second fin spacers includes a nitride.

9. The semiconductor device as claimed in claim 1, further comprising an inner spacer between the second channels, the inner spacer contacting the second source/drain layer and the second gate structure.

10. A semiconductor device, comprising:
a first gate structure on a first region of a substrate, the substrate including the first region and a second region;
first channels spaced apart from each other in a vertical direction perpendicular to an upper surface of the substrate, each of the first channels extending through the first gate structure;
a first source/drain layer at each of opposite sides of the first gate structure, the first source/drain layer contacting the first channels;
a first fin spacer contacting a first portion of a sidewall of the first source/drain layer;
a second fin spacer contacting the first fin spacer and a second portion of the sidewall and an upper surface of the first source/drain layer;
a second gate structure on the second region of the substrate;
second channels spaced apart from each other in the vertical direction, each of the second channels extending through the second gate structure;
a second source/drain layer at each of opposite sides of the second gate structure, the second source/drain layer contacting the second channels; and
a fin spacer structure contacting a portion of a sidewall of the second source/drain layer,
wherein a bottom surface of the first fin spacer is substantially coplanar with a bottom surface of the fin spacer structure, and an uppermost surface of the first fin spacer is lower than an uppermost surface of the fin spacer structure.

11. The semiconductor device as claimed in claim 10, wherein the fin spacer structure has a thickness greater than that of the first fin spacer.

12. The semiconductor device as claimed in claim 10, wherein the fin spacer structure includes third and fourth fin spacers sequentially stacked in a horizontal direction parallel to the upper surface of the substrate.

13. A semiconductor device, comprising:
a substrate including a first region and a second region;
first channels on the first region of the substrate, the first channels being spaced apart from each other in a vertical direction perpendicular to an upper surface of the substrate, and each of the first channels extending in a first direction parallel to the upper surface of the substrate;
second channels spaced apart from each other on the second region of the substrate in the vertical direction, each of the second channels extending in the first direction;
a first gate structure extending in a second direction on the first region of the substrate to cover at least a portion of a surface of each of the first channels, the second direction being parallel to the upper surface of the substrate and crossing the first direction;
a second gate structure extending in the second direction on the second region of the substrate to cover at least a portion of a surface of each of the second channels;
a first source/drain layer at each of opposite sides of the first gate structure in the first direction, the first source/drain layer contacting the first channels; and
a second source/drain layer at each of opposite sides of the second gate structure in the first direction, the second source/drain layer contacting the second channels,
wherein a third channel among the first channels has a length in the first direction gradually decreasing from a top toward a bottom thereof, the third channel being an uppermost one of the first channels, and
wherein each of fourth channels among the first channels and the second channels has a length in the first direction substantially constant from a top toward a bottom thereof, the fourth channels being under the third channel in the first channels.

14. The semiconductor device as claimed in claim 13, wherein a maximum length in the first direction of the third channel is greater than the length in the first direction of each of the fourth channels.

15. The semiconductor device as claimed in claim 14, wherein a minimum length in the first direction of the third channel is substantially equal to the length in the first direction of each of the fourth channels.

16. The semiconductor device as claimed in claim 13, wherein the length in the first direction of the second channels is greater than the length in the first direction of each of the fourth channels.

17. The semiconductor device as claimed in claim 13, wherein the length in the first direction of the second channels is greater than a maximum length in the first direction of the third channel.

18. The semiconductor device as claimed in claim 13, wherein:
an upper portion of the first source/drain layer has a cross-section having a shape of a portion of a pentagon or rectangle, and
an upper portion of the second source/drain layer has a cross-section having a shape of an ellipse.

19. The semiconductor device as claimed in claim 13, wherein the first source/drain layer includes silicon-germanium, and the second source/drain layer includes silicon or silicon carbide.

20. The semiconductor device as claimed in claim 13, further comprising a spacer covering a surface of the first source/drain layer and including a nitride.

\* \* \* \* \*